United States Patent
Tokumaru et al.

(10) Patent No.: US 9,431,541 B2
(45) Date of Patent: Aug. 30, 2016

(54) SEMICONDUCTOR DEVICE

(71) Applicant: SEMICONDUCTOR ENERGY LABORATORY CO., LTD., Atsugi-shi, Kanagawa-ken (JP)

(72) Inventors: Ryo Tokumaru, Kanagawa (JP); Kensuke Yoshizumi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/457,257

(22) Filed: Aug. 12, 2014

(65) Prior Publication Data

US 2015/0053972 A1    Feb. 26, 2015

(30) Foreign Application Priority Data

Aug. 22, 2013    (JP) .................. 2013-172169

(51) Int. Cl.
*H01L 29/786*    (2006.01)

(52) U.S. Cl.
CPC ..... *H01L 29/78609* (2013.01); *H01L 29/7869* (2013.01); *H01L 29/78648* (2013.01); *H01L 29/78696* (2013.01)

(58) Field of Classification Search
CPC .................................. H01L 29/7869
USPC ................. 257/43, 59, 60, 72, 347
See application file for complete search history.

(56) References Cited

U.S. PATENT DOCUMENTS 5,731,856 A    3/1998   Kim et al.
5,744,864 A    4/1998   Cillessen et al.

(Continued)

FOREIGN PATENT DOCUMENTS

EP    1737044 A    12/2006
EP    2226847 A    9/2010

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Cuong Q Nguyen
*Assistant Examiner* — Tong-Ho Kim
(74) *Attorney, Agent, or Firm* — Fish & Richardson P.C.

(57) ABSTRACT

To give favorable electrical characteristics to a semiconductor device. To provide a semiconductor device in which a change in electrical characteristics is suppressed. To provide a highly reliable semiconductor device. The semiconductor device includes a first insulating layer; a second insulating layer including an opening portion, over the first insulating layer; a semiconductor layer over the first insulating layer; a source electrode and a drain electrode that are apart from each other in a region overlapping with the semiconductor layer; a gate electrode overlapping with the semiconductor layer; and a gate insulating layer between the semiconductor layer and the gate electrode. The first insulating layer includes oxide, and the opening portion of the second insulating layer is positioned inside the semiconductor layer when seen from a top surface side and at least part of the opening portion is provided to overlap with the gate electrode.

24 Claims, 22 Drawing Sheets

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,129,719 B2 | 3/2012 | Yamazaki et al. |
| 8,274,077 B2 | 9/2012 | Akimoto et al. |
| 8,440,510 B2 | 5/2013 | Yamazaki |
| 8,461,007 B2 | 6/2013 | Yamazaki |
| 8,466,463 B2 | 6/2013 | Akimoto et al. |
| 8,530,289 B2 | 9/2013 | Yamazaki |
| 8,546,225 B2 | 10/2013 | Yamazaki |
| 8,629,069 B2 | 1/2014 | Akimoto et al. |
| 8,637,347 B2 | 1/2014 | Oikawa et al. |
| 8,669,550 B2 | 3/2014 | Akimoto et al. |
| 8,748,240 B2 | 6/2014 | Yamazaki |
| 8,790,959 B2 | 7/2014 | Akimoto et al. |
| 8,796,069 B2 | 8/2014 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0104851 A1 | 5/2011 | Akimoto et al. |
| 2011/0121290 A1 | 5/2011 | Akimoto et al. |
| 2011/0193080 A1* | 8/2011 | Yamazaki ......... H01L 29/41733 257/43 |
| 2011/0240991 A1* | 10/2011 | Yamazaki ........... H01L 29/7869 257/43 |
| 2011/0260171 A1 | 10/2011 | Yamazaki |
| 2011/0263082 A1 | 10/2011 | Yamazaki |
| 2011/0263091 A1 | 10/2011 | Yamazaki |
| 2013/0009220 A1* | 1/2013 | Yamazaki ......... H01L 29/78696 257/288 |
| 2013/0175530 A1 | 7/2013 | Noda et al. |
| 2014/0103337 A1 | 4/2014 | Yamazaki et al. |
| 2014/0103338 A1 | 4/2014 | Yamazaki et al. |
| 2014/0103340 A1 | 4/2014 | Yamazaki et al. |
| 2014/0106504 A1 | 4/2014 | Yamazaki et al. |
| 2014/0113405 A1 | 4/2014 | Tsubuku et al. |
| 2014/0319516 A1* | 10/2014 | Tanaka et al. .................. 257/43 |
| 2015/0123121 A1 | 5/2015 | Hanaoka et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |

(56) References Cited

FOREIGN PATENT DOCUMENTS

| JP | 2007-096055 A | 4/2007 |
|---|---|---|
| JP | 2007-123861 A | 5/2007 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Synposium Digest of Technical Papers, May 31, 2009, p. 110-112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 1-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 183-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (M=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

(56) References Cited

OTHER PUBLICATIONS

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$—$Ga_2ZnO_4$—$ZnO$ system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)_m$ (m<4):a Zn4s conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT", SID Digest '08 : SID International Synposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 2012-1015.

\* cited by examiner 101 111 112  102 104 105  103  107

FIG. 20A
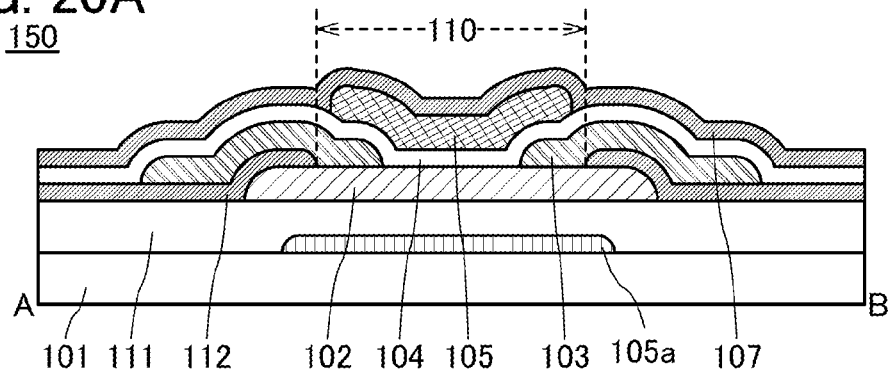
FIG. 20B
FIG. 20C
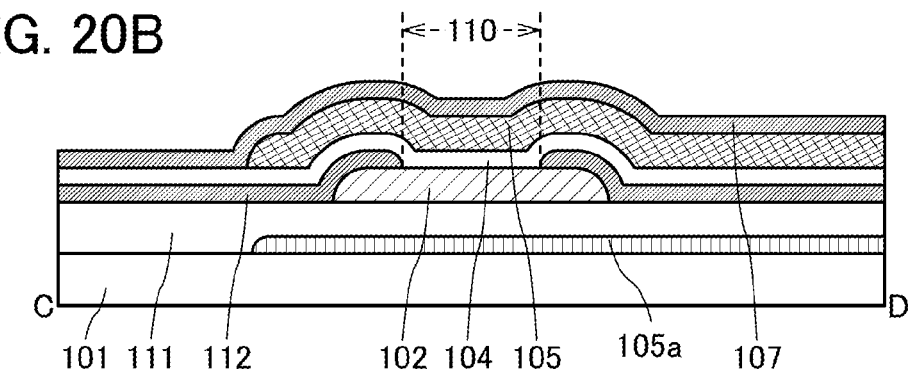
FIG. 20D

SEMICONDUCTOR DEVICE

BACKGROUND OF THE INVENTION

1. Field of the Invention

One embodiment of the present invention relates to a semiconductor device.

In this specification and the like, a semiconductor device generally means a device that can function by utilizing semiconductor characteristics. A transistor, a semiconductor circuit, and an arithmetic device are each one embodiment of semiconductor devices. A memory device, an imaging device, an electro-optical device, a display device, a power generation device (e.g., a thin film solar cell and an organic thin film solar cell), an electronic device, and the like each may include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, an electronic device, a lighting device, an input device, an input/output device, a method for driving any of them, and a method for manufacturing any of them.

2. Description of the Related Art

A technique by which transistors are formed using semiconductor thin films formed over a substrate having an insulating surface has been attracting attention. The transistor is applied to a wide range of electronic devices such as an integrated circuit (IC) or an image display device (also simply referred to as display device). A silicon-based semiconductor material is known as a material for a semiconductor thin film applicable to the transistor. As another material, an oxide semiconductor has been attracting attention.

For example, a technique for formation of a transistor using zinc oxide or an In—Ga—Zn-based oxide semiconductor as an oxide semiconductor is disclosed (see Patent Documents 1 and 2).

REFERENCE

Patent Documents

[Patent Document 1] Japanese Published Patent Application No. 2007-123861

[Patent Document 2] Japanese Published Patent Application No. 2007-096055

SUMMARY OF THE INVENTION

An object of one embodiment of the present invention is to give favorable electrical characteristics to a semiconductor device.

Another object is to provide a semiconductor device in which a change in the electrical characteristics is suppressed. Another object is to provide a highly reliable semiconductor device. Another object is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first insulating layer; a second insulating layer including an opening portion, over the first insulating layer; a semiconductor layer over the first insulating layer; a source electrode and a drain electrode that are apart from each other in a region overlapping with the semiconductor layer; a gate electrode overlapping with the semiconductor layer; and a gate insulating layer between the semiconductor layer and the gate electrode. In the semiconductor device, the first insulating layer includes oxide, and the opening portion of the second insulating layer is positioned inside the semiconductor layer when seen from a top surface side and at least part of the opening portion is provided to overlap with the gate electrode.

It is preferable that the semiconductor layer be provided over the second insulating layer in a region where the semiconductor layer and the second insulating layer overlap, and the semiconductor layer be in contact with the first insulating layer in a region inside the opening portion of the second insulating layer.

Alternatively, it is preferable that the second insulating layer be provided over the semiconductor layer in a region where the semiconductor layer and the second insulating layer overlap, and the source electrode and the drain electrode be provided in contact with a top surface of the semiconductor layer in a region inside the opening portion.

A third insulating layer may be provided between the semiconductor layer and the second insulating layer.

Furthermore, the semiconductor layer preferably includes an oxide semiconductor.

At this time, it is preferable that the semiconductor layer be provided between a first oxide layer and a second oxide layer positioned between the semiconductor layer and the gate insulating layer, and the first oxide layer and the second oxide layer include at least one kind of metal element included in the semiconductor layer.

It is preferable that the first insulating layer include a region containing oxygen at a higher proportion than oxygen in the stoichiometric composition.

It is preferable that the second insulating layer include at least one of silicon nitride, silicon nitride oxide, aluminum oxide, aluminum oxynitride, gallium oxide, gallium oxynitride, yttrium oxide, yttrium oxynitride, hafnium oxide, and hafnium oxynitride.

One embodiment of the present invention can provide a semiconductor device having favorable electrical characteristics. Further, one embodiment of the present invention can provide a semiconductor device in which a change in the electrical characteristics is suppressed, or a highly reliable semiconductor device.

BRIEF DESCRIPTION OF THE DRAWINGS

FIG. 9A, FIG. 9B, FIG. 9C, FIG. 9D1, and FIG. 9D2 illustrate a structural example and an example of a method for manufacturing a semiconductor device of an embodiment.

FIGS. 20A to 20D illustrate structural examples of a semiconductor device of one embodiment.

DETAILED DESCRIPTION OF THE INVENTION

Figure 1A:
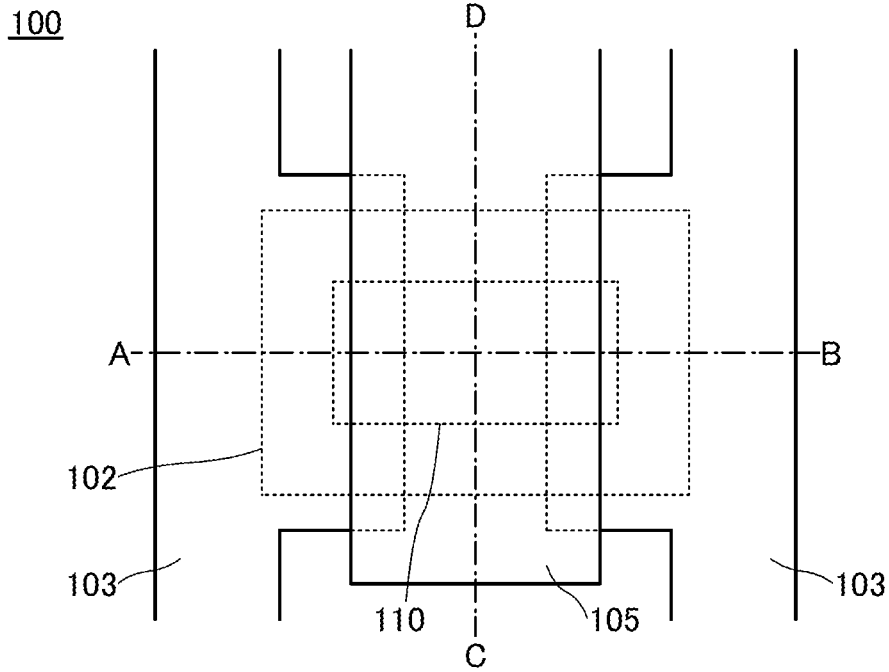
FIGS. 1A to 1C illustrate a structural example of a semiconductor device of one embodiment.

Embodiments will be described in detail with reference to drawings. Note that the present invention is not limited to the following description. It will be readily appreciated by those skilled in the art that modes and details of the present invention can be modified in various ways without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Embodiment 1

In this embodiment, structural examples of a transistor as a semiconductor device, which is one embodiment of the present invention, and an example of a method for manufacturing the transistor are described with reference to drawings.

Structural Example

Figure 1B:
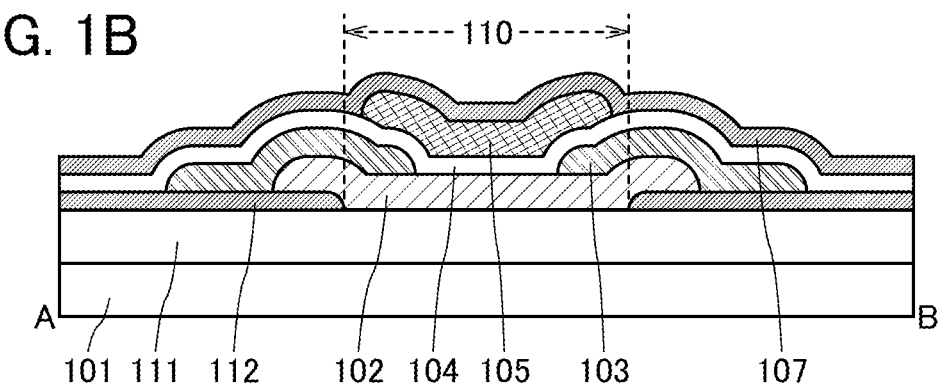
Figure 1C:
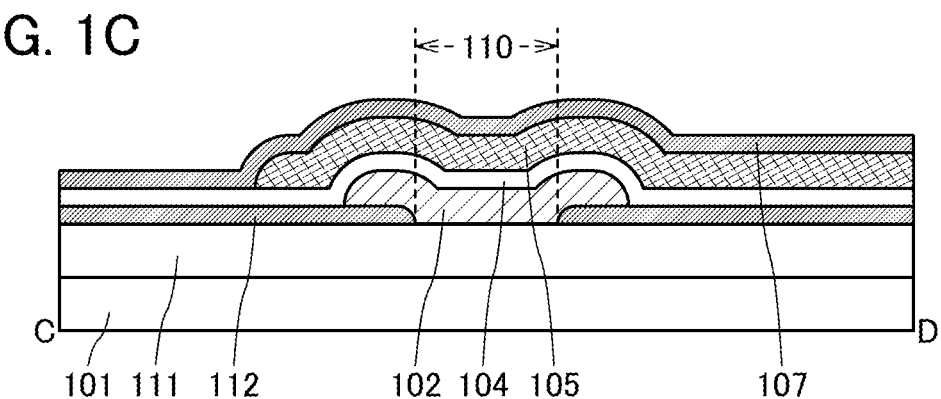

FIG. 1A is a schematic top view of a transistor 100 described in this structural example. FIG. 1B is a schematic cross-sectional view taken along line A-B in FIG. 1A, and FIG. 1C is a schematic cross-sectional view taken along line C-D in FIG. 1A. Note that some components are not illustrated in FIG. 1A for simplicity.

The transistor 100 is provided over a substrate 101 and includes an insulating layer 111; an insulating layer 112 having an opening portion 110, over the insulating layer 111; an island-shaped semiconductor layer 102 over the insulating layer 111; a pair of electrodes 103 in contact with a top surface of the semiconductor layer 102 and apart from each other in a region overlapping with the semiconductor layer 102; a gate electrode 105 over the semiconductor layer 102; and an insulating layer 104 between the semiconductor layer 102 and the gate electrode 105. An insulating layer 107 is provided over the insulating layer 104 and the gate electrode 105.

As shown in FIG. 1A or the like, the opening portion 110 of the insulating layer 112 is positioned inside the semiconductor layer 102 when seen from the top surface, and at least part of the opening portion 110 is provided to overlap with the gate electrode 105.

In a region where the semiconductor layer 102 and the insulating layer 112 overlap, an outer periphery portion (outer edge portion) of the semiconductor layer 102 is provided over the insulating layer 112. In the opening portion 110 of the insulating layer 112, the semiconductor layer 102 is preferably provided in contact with a top surface of the insulating layer 111.

The semiconductor layer 102 may contain a semiconductor such as a silicon-based semiconductor in a region where a channel is formed. It is preferable that the semiconductor layer 102 contain a semiconductor having a wider band gap than silicon. The semiconductor layer 102 is preferably formed using an oxide semiconductor.

For example, the semiconductor layer 102 preferably contains at least indium (In) or zinc (Zn) as the oxide semiconductor. The semiconductor layer 102 more preferably contains an In-M-Zn-based oxide (M is a metal such as Al, Ti, Ga, Ge, Y, Zr, Sn, La, Ce, or Hf).

A case in which an oxide semiconductor is used for the semiconductor layer 102 is described below unless otherwise specified.

One of the pair of electrodes 103 serves as a source electrode and the other serves as a drain electrode.

The insulating layer 104 functions as a gate insulating layer of the transistor 100.

For the insulating layer 111, an insulating material containing oxide is preferably used. In particular, an insulating material from which oxygen is partly released by heating is preferably used.

As an insulating material from which oxygen is released by heating, oxide containing oxygen at a higher proportion than oxygen in the stoichiometric composition is preferably used. Part of oxygen is released by heating from an oxide insulating film containing oxygen at a higher proportion than oxygen in the stoichiometric composition. The oxide insulating film containing oxygen at a higher proportion than oxygen in the stoichiometric composition is an oxide insulating film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

As such a material, a material containing silicon oxide or silicon oxynitride is preferably used. Note that in this specification, silicon oxynitride refers to a material which has a higher proportion of oxygen content than nitrogen, and silicon nitride oxide refers to a material which has a higher proportion of nitrogen content than oxygen.

For the insulating layer 112, a material relatively impermeable to oxygen is preferably used.

As the material relatively impermeable to oxygen, an insulating material such as silicon nitride, silicon nitride oxide, aluminum oxide, aluminum oxynitride, gallium oxide, gallium oxynitride, yttrium oxide, yttrium oxynitride, hafnium oxide, or hafnium oxynitride can be used. The above-described insulating material is relatively impermeable to oxygen, hydrogen, and water.

A large amount of oxygen vacancies in an oxide semiconductor including a channel formation region of a transistor lead to generation of electrons that are carriers in the channel formation region, which causes defects in electrical characteristics; for example, threshold voltages of the transistors vary, leakage current of the transistor increases, or the threshold voltage of the transistor changes due to stress application or the like.

Reduction of oxygen vacancies in the semiconductor layer 102 allows the transistor 100 to have favorable electrical characteristics and a change in the electrical characteristics to be reduced, so that the transistor 100 can have high reliability.

In the manufacturing process of the transistor 100, by performing heat treatment in a step after forming the semiconductor layer 102 or in a step after depositing a semiconductor film to be the semiconductor layer 102, oxygen released from the insulating layer 111 can be supplied to the semiconductor layer 102 through the opening portion 110 of the insulating layer 112.

Figure 2:
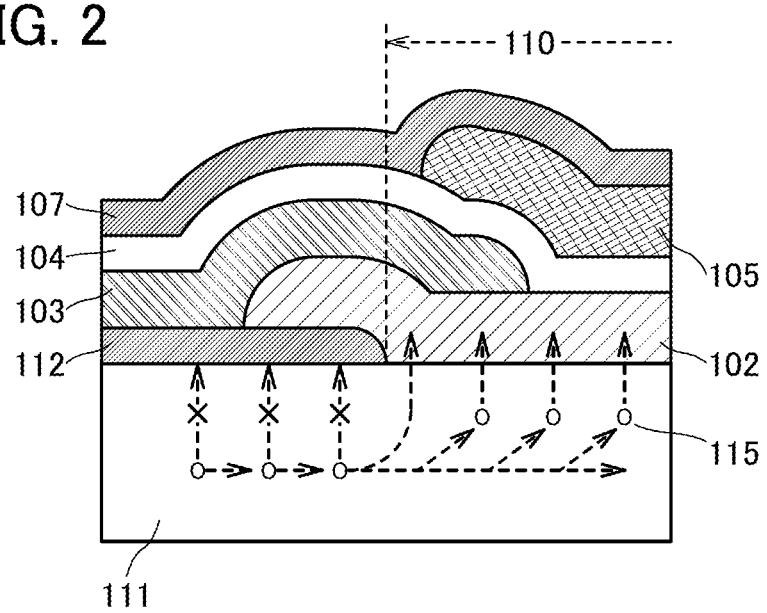
FIG. 2 illustrates a structural example of a semiconductor device of one embodiment.

FIG. 2 is an enlarged schematic cross-sectional view of a part of the transistor 100. FIG. 2 schematically shows how oxygen released from the insulating layer 111 is diffused into the semiconductor layer 102.

In a region that overlaps with the opening portion 110, oxygen 115 in the insulating layer 111 can be diffused, by heat treatment, into the semiconductor layer 102 provided over the insulating layer 111. However, in a region that does not overlap with the opening portion 110, the oxygen 115 in the insulating layer 111 is blocked by the insulating layer 112 provided over the insulating layer 111 and cannot be diffused in a portion over the insulating layer 111.

Here, the oxygen concentration in the insulating layer 111 during the heat treatment is considered. In the region that overlaps with the opening portion 110, the oxygen 115 is released to the semiconductor layer 102; accordingly, the oxygen concentration in the region is reduced. However, in the region that does not overlap with the opening portion 110, the oxygen 115 is not diffused in the portion over the insulating layer 111; therefore, the oxygen concentration in the region is kept high. For this reason, an oxygen concentration gradient is formed in the insulating layer 111. That is, the oxygen concentration of the insulating layer 111 in the region that overlaps with the opening portion 110 is lower than the oxygen concentration of the insulating layer 111 in the region that does not overlap with the opening portion 110.

In the insulating layer 111, the oxygen 115 is diffused from a region with a high oxygen concentration toward a region with a low oxygen concentration in a lateral direction as illustrated in FIG. 2 in accordance with the concentration gradient in the insulating layer 111. Thus, in the region that overlaps with the opening portion 110, the oxygen 115 is diffused into the semiconductor layer 102. Even when the oxygen concentration in the insulating layer 111 directly under the semiconductor layer 102 is reduced, the oxygen 115 is continuously supplied in the lateral direction. Thus, during the heat treatment, the oxygen 115 can be continuously supplied from the insulating layer 111 to the semiconductor layer 102 without depletion of the oxygen 115 to be supplied to the semiconductor layer 102. As a result, oxygen vacancies in the semiconductor layer 102 can be reduced effectively.

Like the insulating layer 111, the insulating layer 107 illustrated in FIGS. 1B and 1C is preferably formed using a material relatively impermeable to oxygen.

By covering the semiconductor layer 102 with the insulating layer 107 including a material relatively impermeable to oxygen, oxygen can be prevented from being released from the semiconductor layer 102 to a portion over the insulating layer 107. Furthermore, oxygen released from the insulating layer 111 can be trapped below the insulating layer 107, resulting in an increase in the amount of oxygen to be supplied to the semiconductor layer 102.

For the insulating layer 107, a material relatively impermeable to water or hydrogen is preferably used. The use of such a material can inhibit water or hydrogen, which is an impurity of an oxide semiconductor, from entering the semiconductor layer 102 from the outside; therefore, a change in the electrical characteristics of the transistor can be suppressed and the transistor can have high reliability.

Note that an insulating layer from which oxygen is released by heating like the insulating layer 111 may be provided under the insulating layer 107 to supply oxygen also from a portion over the semiconductor layer 102 through the insulating layer 104.

As described above, the insulating layer 112 which includes the opening portion and is relatively impermeable to oxygen is provided over the insulating layer 111 which releases part of oxygen by heating, and the semiconductor layer 102 is provided to overlap with the opening portion of the insulating layer 112. With such a structure, a large amount of oxygen can be supplied to the semiconductor layer 102 by the heat treatment in a manufacturing process. As a result, oxygen vacancies in the semiconductor layer 102 can be reduced effectively, and an increase in leakage current of the transistor 100, a change in threshold voltage of the transistor 100 due to stress application, or the like can be suppressed. Furthermore, increase in variation of threshold voltages of the transistors 100 can be suppressed. Thus, the transistor 100 can have excellent electrical characteristics and high reliability. By reducing oxygen vacancies in the semiconductor layer 102, carrier density in the semiconductor layer 102 can be extremely low, and thus, the leakage current of the transistor 100 in an off state can be extremely low.

Note that in the above-described structure, the insulating layer 104 serving as a gate insulating layer is provided between the insulating layer 112 and the insulating layer 107. It is preferable that the insulating layer 112 be in contact with the insulating layer 107 in a region outside a region that overlaps with the semiconductor layer 102.

Figure 3A:
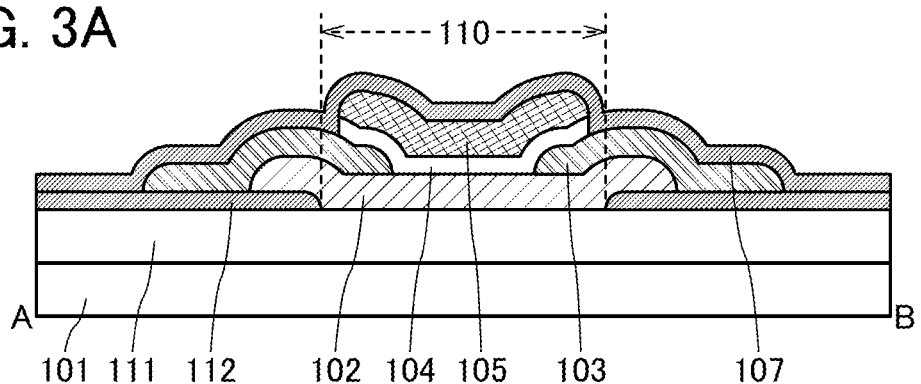
FIGS. 3A and 3B illustrate a structural example of a semiconductor device of one embodiment.
Figure 3B:
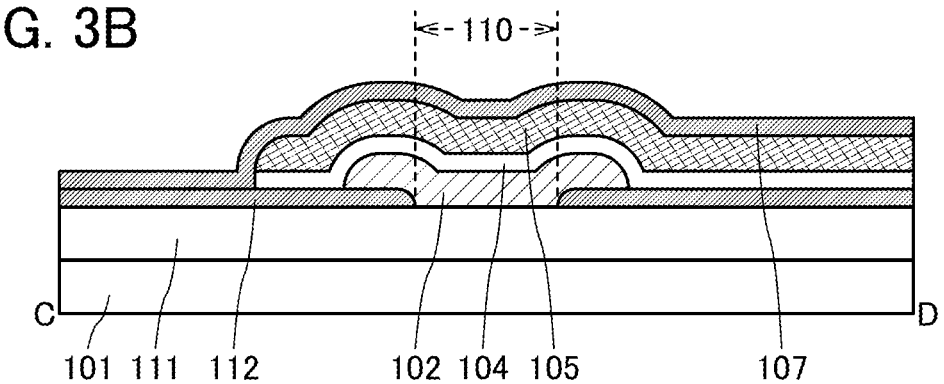
Figure 4A:
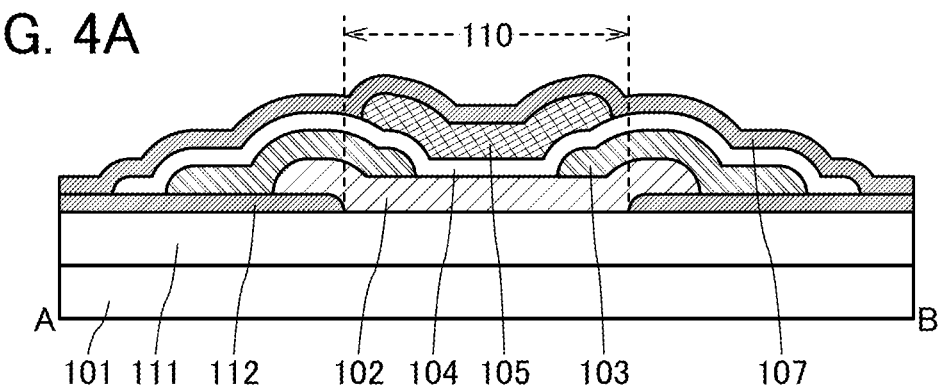
FIGS. 4A and 4B illustrate a structural example of a semiconductor device of one embodiment.
Figure 4B:
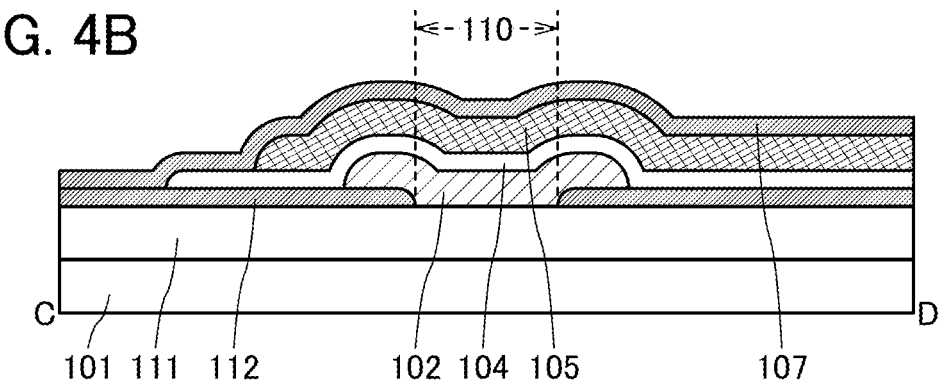

For example, as illustrated in FIGS. 3A and 3B, the insulating layer 104 and the gate electrode 105 may be formed by processing with the use of the same photomask so that the top surface shapes of the insulating layer 104 and the gate electrode 105 are substantially the same. As illustrated in FIGS. 4A and 4B, the insulating layer 104 may be formed by processing so that the gate electrode 105 is positioned inside the insulating layer 104 when seen from the above.

Note that in this specification and the like, the expression "top surface shapes (of two or more layers) are substantially the same" means that outlines of stacked two or more layers at least partly overlap with each other. For example, what is expressed by the expression includes an upper layer and a lower layer that are processed with the use of the same mask pattern or partly processed with the use of the same mask pattern. In some cases, however, the outlines of such upper and lower layers do not completely overlap with each other; for example, the edge of the upper layer may be on an inner/outer side than the edge of the lower layer. The expression "top surface shapes (of two or more layers) are substantially the same" may also apply to such cases.

As described above, the insulating layer 112 and the insulating layer 107 are in contact with each other in a position outside the semiconductor layer 102 so that the semiconductor layer 102 is wrapped with the insulating layer 112 and the insulating layer 107, whereby oxygen released from the insulating layer 111 can be effectively trapped in a portion under the insulating layer 107.

Figure 17A:
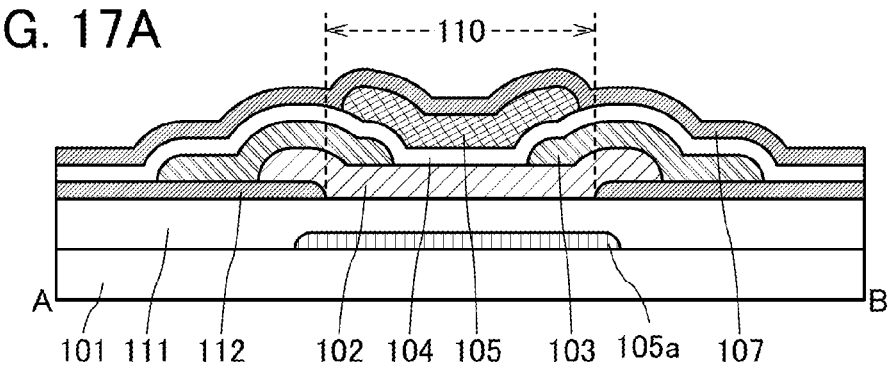
FIGS. 17A to 17D illustrate structural examples of a semiconductor device of one embodiment.
Figure 17B:
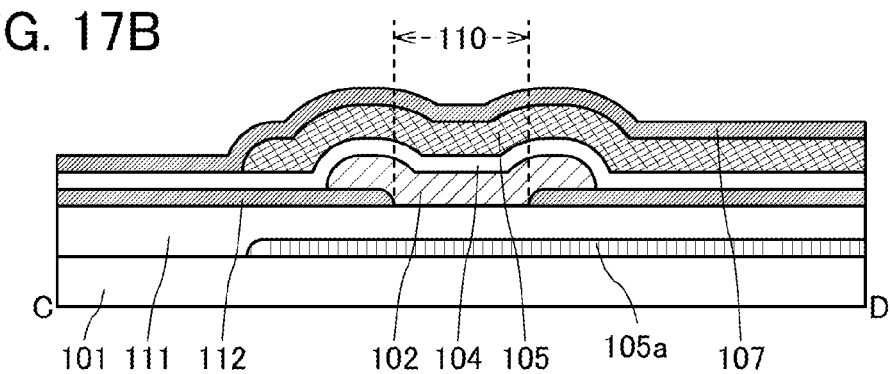
Figure 17C:
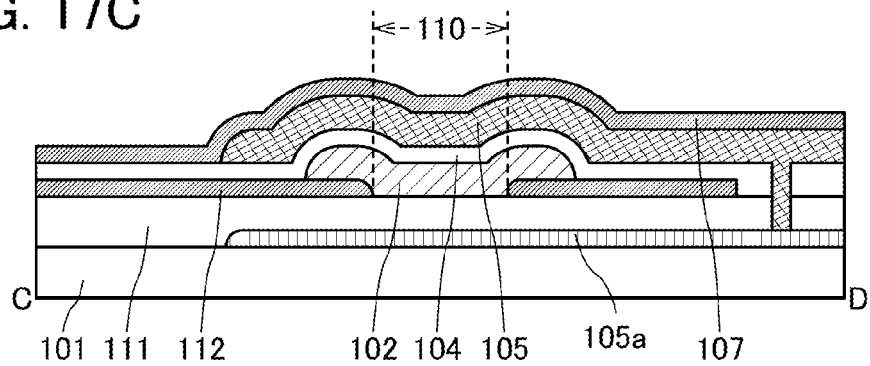
Figure 17D:
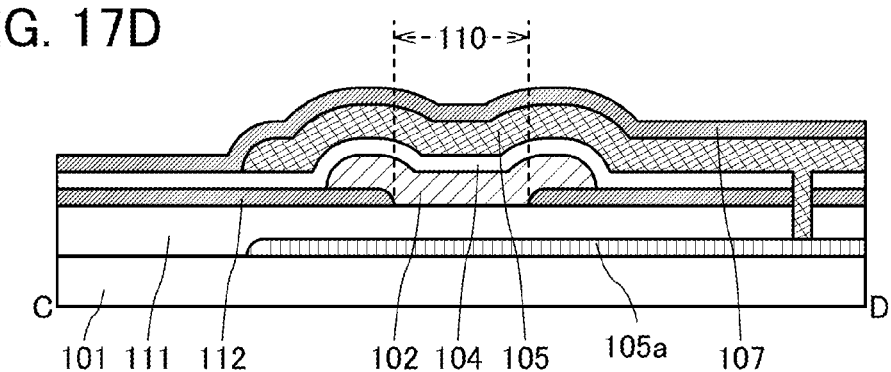

Furthermore, a gate electrode 105a may be provided in addition to the gate electrode 105. Examples in that case are shown in FIGS. 17A and 17B. Note that the gate electrode 105a may be supplied with a constant voltage or a pulse signal. Furthermore, the gate electrode 105a may be electrically connected to the gate electrode 105; examples in that case are shown in FIGS. 17C and 17D.

Figure 18A:
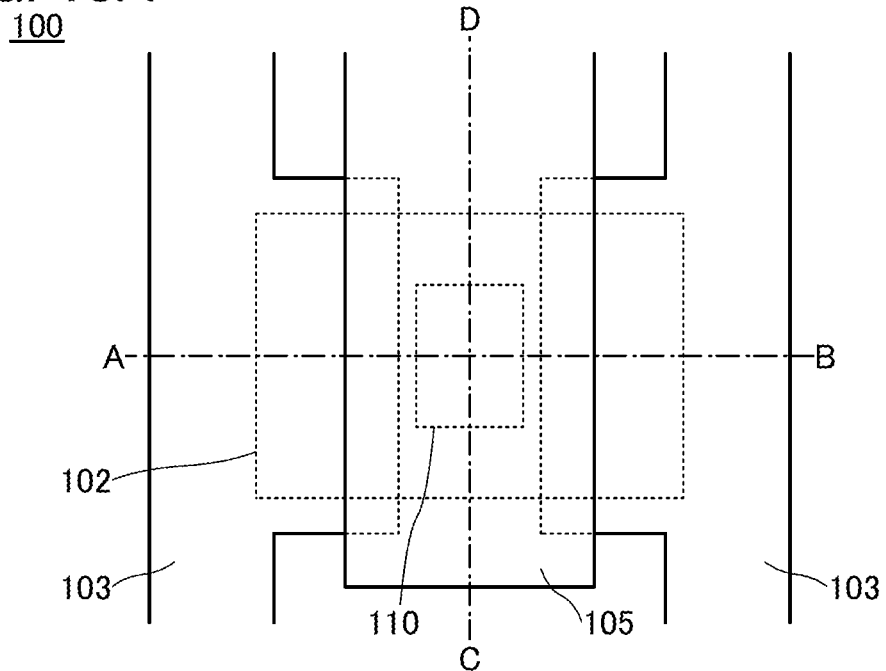
FIGS. 18A to 18C illustrate a structural example of a semiconductor device of one embodiment.
Figure 18B:
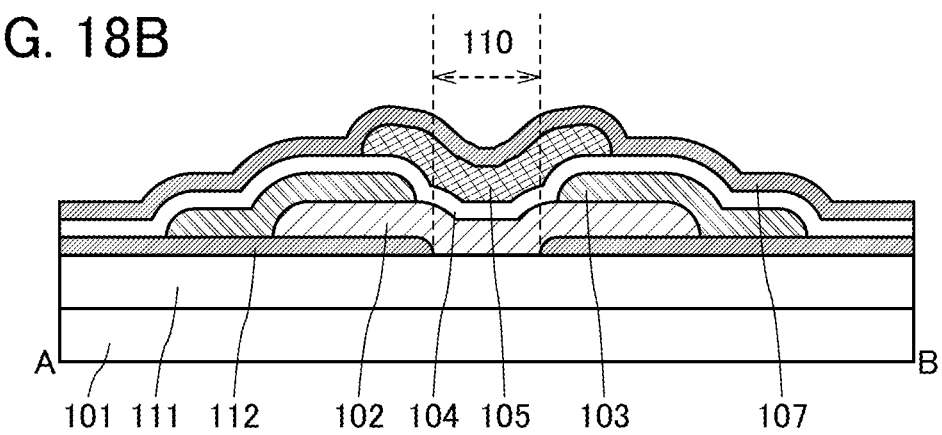
Figure 18C:
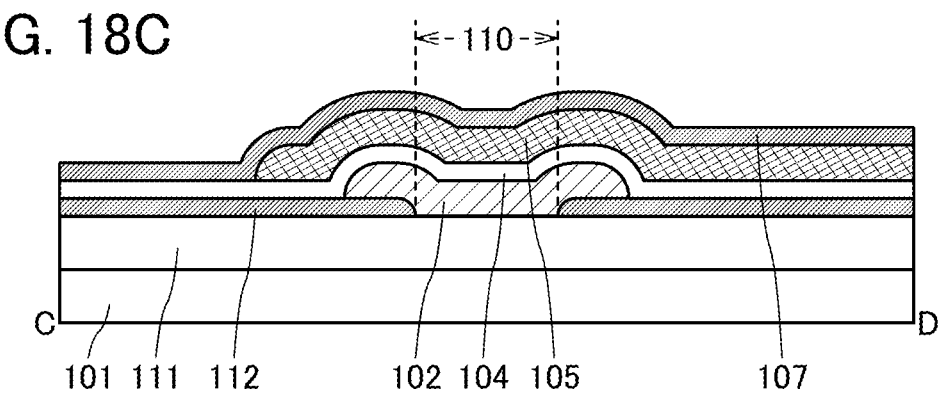

Note that the layout of the opening portion 110 can be changed variously. FIGS. 18A to 18C illustrate an example of the case where the opening portion 110 is smaller than that in FIGS. 1A to 1C.

[Components]

Components of the transistor 100 are described below.

<Semiconductor Layer>

As a semiconductor applicable to a semiconductor layer in which a channel of a transistor is formed, for example, a semiconductor material such as silicon or germanium, a compound semiconductor material, an organic semiconductor material, or an oxide semiconductor material may be used.

Further, there is no particular limitation on the crystallinity of a semiconductor used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of transistor characteristics can be reduced.

For example, in the case of where silicon is used as the semiconductor, amorphous silicon, microcrystalline silicon, polycrystalline silicon, single crystal silicon, or the like can be used.

Using an oxide semiconductor as a semiconductor contained in the semiconductor layer is particularly preferable. A semiconductor material having a wider band gap and a lower carrier density than silicon is preferably used because off-state leakage current of the transistor can be reduced.

As the semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

The use of such materials for the semiconductor layer makes it possible to provide a highly reliable transistor in which a change in the electrical characteristics is suppressed.

Note that details of a preferable mode and a formation method of an oxide semiconductor that can be used for the semiconductor layer are described later in an embodiment described below.

<Substrate>

There is no particular limitation on the property of a material and the like of the substrate 101 as long as the material has heat resistance enough to withstand at least heat treatment in the process. For example, a glass substrate, a ceramic substrate, a quartz substrate, a sapphire substrate, or an yttria-stabilized zirconia (YSZ) substrate may be used as the substrate 101. Alternatively, a single crystal semiconductor substrate or a polycrystalline semiconductor substrate made of silicon or silicon carbide, a compound semiconductor substrate made of silicon germanium or the like, an SOI substrate, or the like can be used.

Still alternatively, any of the above-described semiconductor substrates or the SOI substrate provided with a semiconductor element may be used as the substrate 101. In this case, the transistor 100 is formed over the substrate 101 with an interlayer insulating layer provided therebetween. The transistor 100 in this case may have a structure in which at least one of the gate electrode 105 and the pair of electrodes 103 is electrically connected to the above semiconductor element by a connection electrode embedded in the interlayer insulating layer. The transistor 100 is provided over the semiconductor element with the interlayer insulating layer provided therebetween; thus, an occupation area can be smaller than that in the case where the interlayer insulating layer and the semiconductor element are formed over the same surface.

<Gate Electrode>

The gate electrode 105 can be formed using a metal selected from aluminum, chromium, copper, tantalum, titanium, molybdenum, and tungsten; an alloy containing any of these metals as a component; an alloy containing any of these metals in combination; or the like. Alternatively, a nitride of any of the above metals or the above alloy may be used. Manganese or zirconium may be used as the metal. Alternatively, a semiconductor typified by polycrystalline silicon doped with an impurity element such as phosphorus, or a silicide such as nickel silicide may be used for the gate electrode 105. Furthermore, the gate electrode 105 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film containing aluminum and one or more metals selected from titanium, tantalum, tungsten, molybdenum, chromium, neodymium, and scandium; or a nitride film of the alloy film may be used.

<Gate Insulating Layer>

The insulating layer 104 may be formed with a single-layer structure or a stacked-layer structure using, for example, one or more of silicon oxide, silicon oxynitride, silicon nitride oxide, aluminum oxide, hafnium oxide, gallium oxide, Ga—Zn-based metal oxide, silicon nitride, and the like.

Alternatively, the insulating layer 104 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide.

When the specific material is used for the gate insulating layer, electrons are trapped in the gate insulating layer under the specific conditions and the threshold voltage can be increased. For example, like a stacked-layer film of silicon oxide and hafnium oxide, part of the gate insulating layer uses a material having a lot of electron trap states, such as hafnium oxide, aluminum oxide, and tantalum oxide, and the state where the potential of the gate electrode is higher than that of the source electrode or the drain electrode is kept for one second or more, typically one minute or more at a higher temperature (a temperature higher than the operating temperature or the storage temperature of the semiconductor device, or a temperature of 125° C. or higher and 450° C. or lower, typically a temperature of 150° C. or higher and 300° C. or lower). Thus, electrons are moved from the semiconductor layer to the gate electrode, and some of the electrons are trapped by the electron trap states.

In the transistor in which a necessary amount of electrons is trapped by the electron trap states in this manner, the threshold voltage is shifted in the positive direction. By controlling the voltage of the gate electrode, the amount of electrons to be trapped can be controlled, and thus the threshold voltage can be controlled. Furthermore, the treatment for trapping the electrons may be performed in the manufacturing process of the transistor.

For example, the treatment is preferably performed at any step before factory shipment, such as after the formation of a wire metal connected to the source electrode or the drain electrode of the transistor, after the preceding process (wafer processing), after a wafer-dicing step, after packaging, or the like. In any case, it is preferable that the transistor be not exposed to a temperature higher than or equal to 125° C. for one hour or more after that.

<Source Electrode and Drain Electrode>

The pair of electrodes 103 is formed with a single-layer structure or a stacked-layer structure using, for example, any of metals such as aluminum, titanium, chromium, nickel, copper, yttrium, zirconium, molybdenum, silver, tantalum, and tungsten and an alloy containing any of these metals as a main component. Alternatively, a nitride of any of the metals may be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

The above is the descriptions of the components.

Modification Example

Structural examples of a transistor that are partly different from the structure of the transistors described in the above example are described below. Note that description of the portions already described is omitted and different portions are described in detail. Even when positions and shapes of components are different from those in the above example, the same reference numerals are used as long as the components have the same functions as those in the above example, and detailed description thereof is omitted in some cases.

A semiconductor device of one embodiment of the present invention preferably includes an oxide layer, which contains as its constituent element at least one of the metal elements constituting an oxide semiconductor layer, between the oxide semiconductor layer and an insulating layer that overlaps with the oxide semiconductor layer. In this way, a trap state is prevented from being formed in the interface between the oxide semiconductor layer and the insulating layer that overlaps with the oxide semiconductor layer.

That is, one embodiment of the present invention preferably has a structure in which at least one of the top surface and the bottom surface of at least the channel formation region of the oxide semiconductor layer is in contact with the oxide layer that functions as a barrier film for preventing formation of an interface state of the oxide semiconductor layer. With this structure, formation of oxygen vacancies and entry of impurities which cause generation of carriers in the oxide semiconductor layer and the interface can be prevented. Thus, a highly purified intrinsic oxide semiconductor layer can be obtained. Obtaining a highly purified intrinsic oxide semiconductor layer refers to purifying or substantially purifying the oxide semiconductor layer to be an intrinsic or substantially intrinsic oxide semiconductor layer. It is thus possible to reduce variation in the electrical characteristics of a transistor including the oxide semiconductor layer and to provide a highly reliable semiconductor device.

Note that in this specification and the like, in the case of the substantially intrinsic oxide semiconductor layer, the carrier density thereof is lower than $1 \times 10^{17}/cm^3$, lower than $1 \times 10^{15}/cm^3$, or lower than $1 \times 10^{13}/cm^3$. With a highly purified intrinsic oxide semiconductor layer, the transistor can have stable electric characteristics.

More specifically, the following structures can be employed for example.

Modification Example 1

Figure 5A:
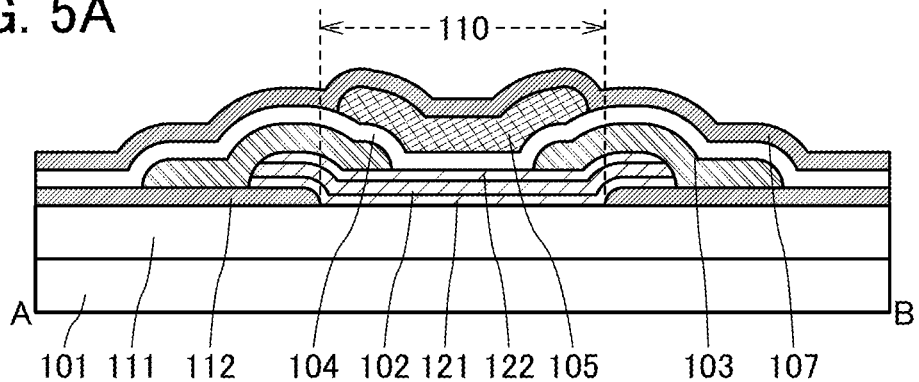
FIGS. 5A to 5C each illustrate a structural example of a semiconductor device of one embodiment.

FIG. 5A is a schematic cross-sectional diagram in the channel length direction of a transistor described as an example below. Note that a schematic top view of the transistor can be referred to FIG. 1A. A main difference between the transistor illustrated in FIG. 5A and the transistor 100 illustrated in FIGS. 1A to 1C is that the transistor illustrated in FIG. 5A includes a first oxide layer 121 and a second oxide layer 122.

The first oxide layer 121 is provided between the semiconductor layer 102 and the insulating layers 112 and 111.

The second oxide layer 122 is provided between the semiconductor layer 102 and the insulating layer 104. Specifically, the top surface of the second oxide layer 122 is in contact with the bottom surfaces of the pair of electrodes 103 and the bottom surface of the insulating layer 104.

The first oxide layer 121 and the second oxide layer 122 each contain an oxide containing one or more metal elements that are also contained in the semiconductor layer 102.

Note that the boundary between the semiconductor layer 102 and the first oxide layer 121 and/or the boundary between the semiconductor layer 102 and the second oxide layer 122 is not clear in some cases.

For example, the first oxide layer 121 and the second oxide layer 122 contain In and/or Ga; typically, a material such as an In—Ga-based oxide, an In—Zn-based oxide, or an In-M-Zn-based oxide (M is Al, Ti, Ga, Y, Zr, La, Ce, Nd, or Hf) that has an energy level of the conduction band minimum closer to the vacuum level than that of the semiconductor layer 102 is used. Typically, the difference between the energy of the conduction band minimum of the first oxide layer 121 or the second oxide layer 122 and the energy of the conduction band minimum of the semiconductor layer 102 is preferably 0.05 eV or higher, 0.07 eV or higher, 0.1 eV or higher, or 0.15 eV or higher and 2 eV or lower, 1 eV or lower, 0.5 eV or lower, or 0.4 eV or lower.

An oxide having a Ga (serving as a stabilizer) content higher than that of the semiconductor layer 102 is used for the first oxide layer 121 and the second oxide layer 122, between which the semiconductor layer 102 is sandwiched, in which case release of oxygen from the semiconductor layer 102 can be inhibited.

When an In—Ga—Zn-based oxide in which the atomic ratio of In to Ga and Zn is 1:1:1 or 3:1:2 is used for the semiconductor layer 102, for example, an In—Ga—Zn-based oxide in which the atomic ratio of In to Ga and Zn is 1:3:2, 1:3:4, 1:3:6, 1:6:4, 1:6:8, 1:6:10, or 1:9:6 can be used for the first oxide layer 121 or the second oxide layer 122. Note that the atomic ratio of each of the semiconductor layer 102, the first oxide layer 121, and the second oxide layer 122 may vary within a range of ±20% of any of the above-described atomic ratios as an error. For the first oxide layer 121 and the second oxide layer 122, materials with the same composition or material with different compositions may be used.

Further, when an In-M-Zn-based oxide is used for the semiconductor layer 102, an oxide containing metal elements in the atomic ratio satisfying the following conditions is preferably used for a target for depositing the semiconductor film serving as the semiconductor layer 102. Given that the atomic ratio of the metal elements in the oxide is In:M:Zn=$x_1$:$y_1$:$z_1$, $x_1/y_1$ is greater than or equal to ⅓ and less than or equal to 6, preferably greater than or equal to 1 and less than or equal to 6, and $z_1/y_1$ is greater than or equal to ⅓ and less than or equal to 6, preferably greater than or equal to 1 and less than or equal to 6. Note that when $z_1/y_1$ is less than or equal to 6, a CAAC-OS film to be described later is easily formed. Typical examples of the atomic ratio of the metal elements in the target are In:M:Zn=1:1:1, In:M:Zn=3:1:2, or the like.

When an In-M-Zn-based oxide is used for the first oxide layer 121 and the second oxide layer 122, an oxide containing metal elements in the following atomic ratio is preferably used for a target for depositing oxide films serving as the first oxide layer 121 and the second oxide layer 122. Given that the atomic ratio of the metal elements in the target is In:M:Zn=$x_2$:$y_2$:$z_2$, it is preferable that $x_2/y_2$ be less than $x_1/y_1$, and $z_2/y_2$ be greater than or equal to ⅓ and less than or equal to 6, preferably greater than or equal to 1 and less than or equal to 6. Note that when $z_2/y_2$ is less than or equal to 6, a CAAC-OS film to be described later is easily formed. Typical examples of the atomic ratio of the metal elements in the target are In:M:Zn=1:3:4, In:M:Zn=1:3:6, In:M:Zn=1:3:8, or the like.

By using a material in which the energy level of the conduction band minimum is closer to the vacuum level than that of the semiconductor layer 102 is for the first oxide layer 121 and the second oxide layer 122, a channel is mainly formed in the semiconductor layer 102, so that the semiconductor layer 102 serves as a main current path. When the semiconductor layer 102 in which a channel is formed is sandwiched between the first oxide layer 121 and the second oxide layer 122 containing the same metal element as described above, formation of interface states between these layers is suppressed, and thus reliability of the electrical characteristics of the transistor is improved.

Note that, without limitation to that described above, a material with an appropriate composition may be used depending on required semiconductor characteristics and electrical characteristics (e.g., field-effect mobility and threshold voltage) of a transistor. In order to obtain the required semiconductor characteristics of the transistor, it is preferable that the carrier density, the impurity concentration, the defect density, the atomic ratio of a metal element to oxygen, the interatomic distance, the density, and the like of each of the semiconductor layer 102, the first oxide layer 121, and the second oxide layer 122 be set to appropriate values.

Here, the thickness of the semiconductor layer 102 is preferably larger than that of the first oxide layer 121. The thicker the semiconductor layer 102 is, the larger the on-state current of the transistor is. The thickness of the first oxide layer 121 may be set as appropriate as long as formation of an interface state at an interface with the semiconductor layer 102 is inhibited. For example, the thickness of the semiconductor layer 102 is larger than that of the first oxide layer 121, preferably 2 times or more, further preferably 4 times or more, still further preferably 6 times or more as large as that of the first oxide layer 121. Note that the above does not apply in the case where the on-state current of the transistor does not need to be increased, and the thickness of the first oxide layer 121 may be thicker than the semiconductor layer 102.

The thickness of the second oxide layer 122 may be set as appropriate, in a manner similar to that of the first oxide layer 121, as long as formation of an interface state at an interface with the semiconductor layer 102 is inhibited. For example, the thickness of the second oxide layer 122 may be set smaller than or equal to that of the first oxide layer 121. The second oxide layer 122 preferably has a small thickness because the thick second oxide layer 122 might make it difficult for an electric field by the gate electrode 105 to extend to the semiconductor layer 102. For example, the second oxide layer 122 may be thinner than the semiconductor layer 102. Note that the thickness of the second oxide layer 122 is not limited to the above, and may be set as appropriate depending on a driving voltage of the transistor in consideration of the withstanding voltage of the insulating layer 104 and the like.

Here, in the case where the semiconductor layer 102 is in contact with an insulating layer including a different constituent element (e.g., an insulating layer including a silicon oxide film), an interface state is sometimes formed at the interface of the two layers and the interface state forms a channel. At this time, a second transistor having a different threshold voltage appears, so that an apparent threshold voltage of the transistor is varied. In the transistor having this structure, however, the first oxide layer 121 containing one of more kinds of metal elements constituting the semiconductor layer 102 is provided, which makes it difficult for an interface state to be formed at the interface between the first oxide layer 121 and the semiconductor layer 102. Thus, providing the first oxide layer 121 makes it possible to reduce variations and fluctuation in the electrical characteristics of the transistor, such as threshold voltage.

When a channel is formed at the interface between the insulating layer 104 and the semiconductor layer 102, interface scattering occurs at the interface and the field-effect mobility of the transistor is reduced in some cases. In the transistor having this structure, however, since the second oxide layer 122 contains one or more kinds of metal elements constituting the semiconductor layer 102, scattering of carriers is less likely to occur at an interface between the semiconductor layer 102 and the second oxide layer 122, and thus the field-effect mobility of the transistor can be increased.

Figure 19A:
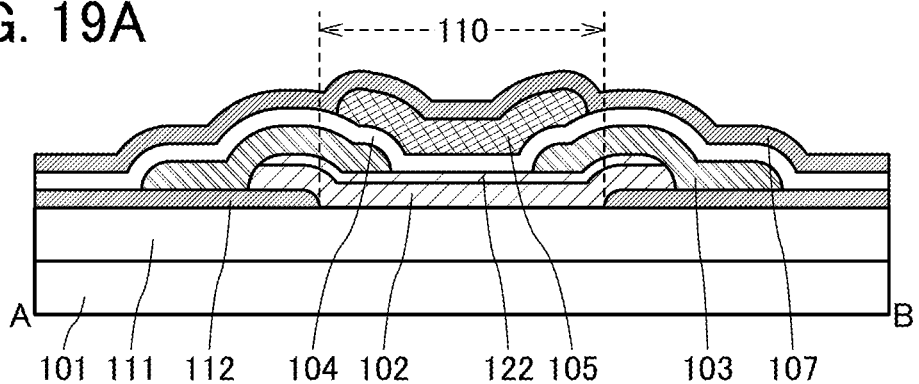
FIGS. 19A to 19D each illustrate a structural example of a semiconductor device of one embodiment.
Figure 19B:
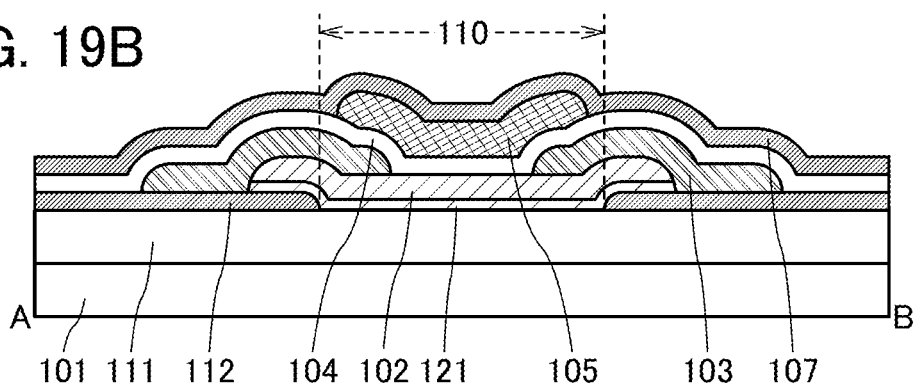

Note that although FIG. 5A illustrates the structure including the first oxide layer 121 and the second oxide layer 122, one embodiment of the present invention is not limited thereto. A structure in which one of the first oxide layer 121 and the second oxide layer 122 is not provided may be used. For example, FIG. 19A illustrates an example of a structure in which the first oxide layer 121 is not provided, and FIG. 19B illustrates an example of a structure in which the second oxide layer 122 is not provided.

Modification Example 2

Figure 5B:
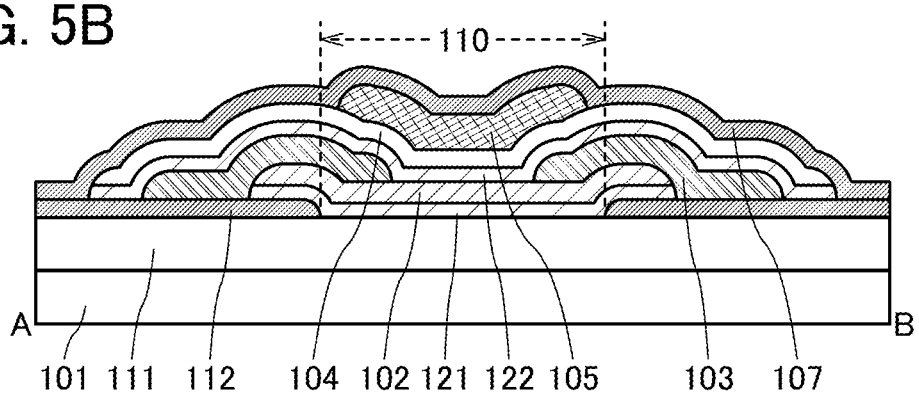

FIG. 5B is a schematic cross-sectional view in the channel length direction of a transistor described as an example below. Note that FIG. 1A can be cited as a schematic top view of the transistor. A main difference between the transistor illustrated in FIG. 5B and the transistor illustrated in FIGS. 4A and 4B is that the transistor illustrated in FIG. 5B includes the first oxide layer 121 and the second oxide layer 122.

As in the modification example 1, the first oxide layer 121 is provided between the semiconductor layer 102 and the insulating layers 112 and 111.

The bottom surface of the second oxide layer 122 is in contact with the top surfaces of the pair of electrodes 103. Furthermore, the second oxide layer 122 is in contact with the top surface of the semiconductor layer 102 in a region where the pair of electrodes 103 is not provided.

In the structure illustrated in FIG. 5B, the second oxide layer 122 and the insulating layer 104 are formed by processing with the use of the same photomask so that the top surface shapes of the second oxide layer 122 and the insulating layer 104 are substantially the same.

With such a structure, the contact area between the semiconductor layer 102 in which the channel is formed and each of the pair of electrodes 103 can be increased, so that the contact resistance thereof can be reduced. As a result, the on-state current of the transistor can be increased.

Figure 19C:
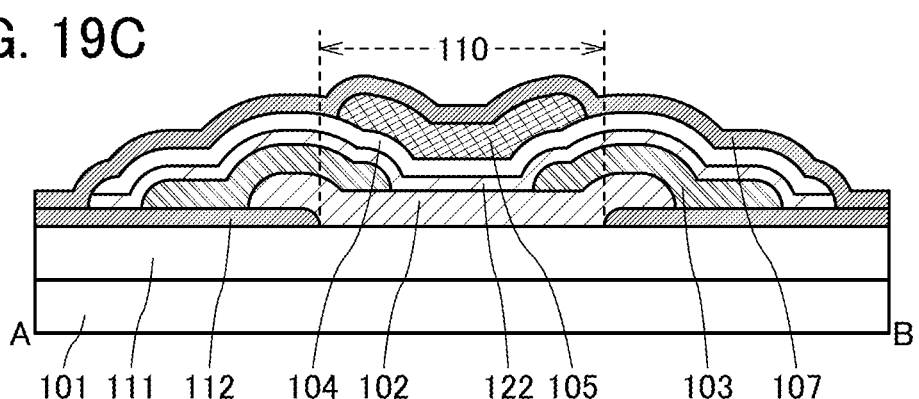

Note that although FIG. 5B illustrates the structure including the first oxide layer 121 and the second oxide layer 122, one embodiment of the present invention is not limited thereto. A structure in which one of the first oxide layer 121 and the second oxide layer 122 is not provided may be used. For example, FIG. 19C illustrates an example of a structure in which the first oxide layer 121 is not provided.

Figure 5C:
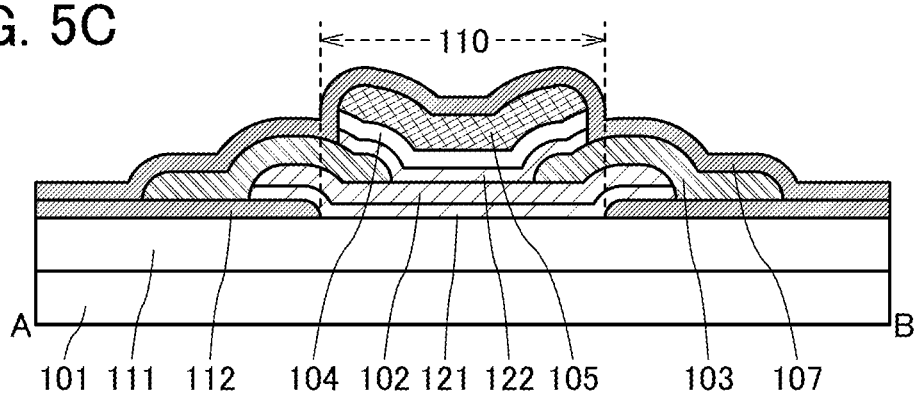

Note that as illustrated in FIG. 5C, processing may be performed with the use of the same photomask so that the top surface shapes of the second oxide layer 122, the insulating layer 104, and the gate electrode 105 are substantially the same.

Figure 19D:
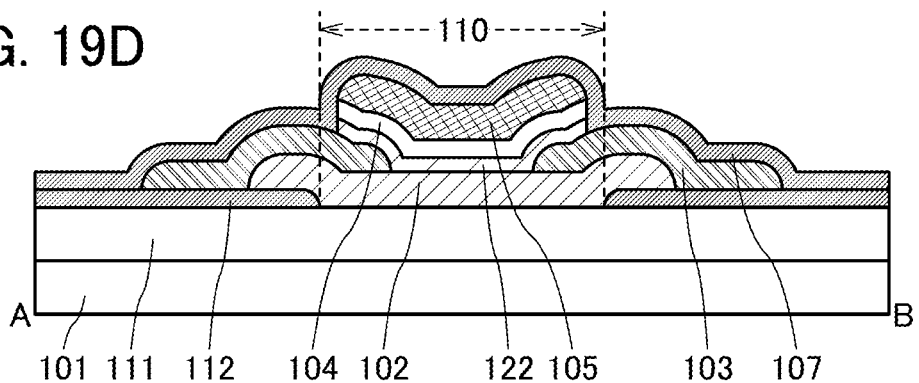

Note that although FIG. 5C illustrates the structure including the first oxide layer 121 and the second oxide layer 122, one embodiment of the present invention is not limited thereto. A structure in which one of the first oxide layer 121 and the second oxide layer 122 is not provided may be used. For example, FIG. 19D illustrates an example of a structure in which the first oxide layer 121 is not provided.

The above is the description of the modification examples.

Example of Manufacturing Method

An example of a method for manufacturing the transistor 100 described in the above structural example is described below with reference to drawings. FIGS. 6A to 6E are schematic cross-sectional views of some steps in the manufacturing method described below.

<Formation of Insulating Layer>

First, the insulating layer 111 is formed over the substrate 101.

The insulating layer 111 can be deposited by a sputtering method, a chemical vapor deposition (CVD) method, an evaporation method, a molecular beam epitaxy (MBE) method, an atomic layer deposition (ALD) method, a pulsed laser deposition (PLD) method, or the like.

In order to make the insulating layer 111 excessively contain oxygen, the insulating layer 111 may be deposited in an oxygen atmosphere, for example. Alternatively, a region excessively containing oxygen may be formed by introducing oxygen into the insulating layer 111 that has been deposited. Both the methods may be combined.

For example, oxygen (at least including any of oxygen radicals, oxygen atoms, and oxygen ions) is introduced into the insulating layer 111 that has been deposited, whereby a region excessively containing oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, dinitrogen monoxide, nitrogen dioxide, carbon dioxide, carbon monoxide, and the like can be used. Further, a rare gas may be included in the gas containing oxygen for the oxygen introduction treatment.

The thickness of the insulating layer 111 is preferably large for an increase in the amount of released oxygen. Thus, the insulating layer 111 is preferably thick but not so thick as to adversely affect productivity. For example, the thickness of the insulating layer 111 is greater than or equal to 50 nm, preferably greater than or equal to 100 nm, more preferably greater than or equal to 200 nm.

Note that in the case where the insulating layer 111 is deposited thick, planarization treatment using a chemical mechanical polishing (CMP) method or the like may be performed in order to improve the planarity of a top surface of the insulating layer 111.

Next, the insulating layer 112 is formed over the insulating layer 111.

The insulating layer 112 can be deposited by a sputtering method, a CVD method, an evaporation method, an MBE method, an ALD method, a PLD method, or the like.

The insulating layer 112 is preferably deposited under an atmosphere containing oxygen, in which case oxygen can be introduced to the insulating layer 111.

For example, the insulating layer 112 can be deposited under an oxygen atmosphere or a mixed atmosphere of oxygen and a rare gas when the insulating layer 112 is formed by a sputtering method using aluminum oxide as a sputtering target; thus, oxygen can be introduced to the insulating layer 111.

The thickness of the insulating layer 112 is preferably thin but not so thin as to decrease impermeability to oxygen. When the insulating layer 112 is formed thin, a step in the outer periphery of the opening portion 110 to be formed later is lowered, so that coverage with the semiconductor layer 102 formed thereover can be improved.

When the thickness of the insulating layer 112 is, for example, greater than or equal to 5 nm, the insulating layer 112 can have impermeability to oxygen that is high enough. Although the insulating layer 112 is more impermeable to oxygen as the insulating layer 112 is thicker, the thickness of the insulating layer 112 may be set to, for example, less than or equal to 200 nm or less than or equal to 50 nm so that coverage with a thin film to be formed thereover is not adversely affected.

<Formation of Opening Portion>

Figure 6A:
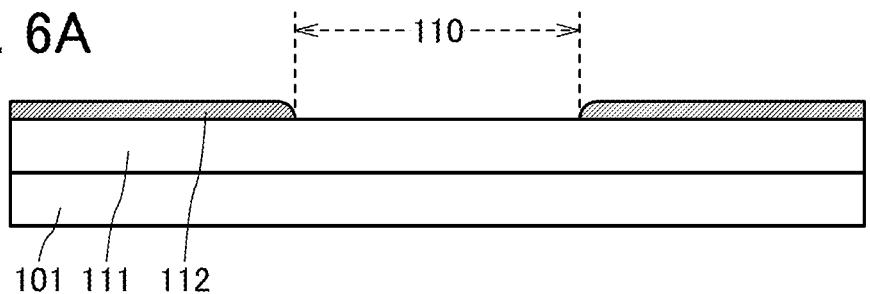
FIGS. 6A to 6E illustrate an example of a method for manufacturing the semiconductor device of one embodiment.

Next, the opening portion 110 is formed in the insulating layer 112 (FIG. 6A).

A resist mask is formed over the insulating layer 112 by a photolithography method or the like and an unnecessary portion of the insulating layer 112 is etched. Then, the resist mask is removed; thus, the opening portion 110 can be formed in the insulating layer 112.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use EUV, X-rays, or an electron beam because extremely minute processing can be performed. Note that in the case of performing exposure by scanning of a beam such as an electron beam, a photomask is not needed.

An organic resin film having a function of improving adhesion between the film to be processed and a resist film may be formed before the resist film serving as a resist mask is formed. The organic resin film can be formed to cover a step under the film by a method such as a spin coating method, and thus can reduce variation in thickness of the resist mask over the organic resin film. In the case of minute processing, in particular, a material serving as a film having a function of preventing reflection of light for the exposure is preferably used for the organic resin film. Examples of the organic resin film having such a function include a bottom anti-reflection coating (BARC) film. The organic resin film may be removed at the same time as the resist mask or after the removal of the resist mask.

As shown in FIG. 6A, the insulating layer 112 is preferably etched so that an end portion of the insulating layer 112 on the opening portion 110 side has a tapered shape. When the end portion has such a shape, coverage with the semiconductor layer 102 to be formed later can be improved. Processing the end portion of the insulating layer 112 on the opening portion 110 side into such a tapered shape can reduce the adverse effect on coverage with the semiconductor layer 102 even when the insulating layer 112 is thick (e.g., greater than 200 nm).

<Formation of Semiconductor Layer>

Figure 6B:
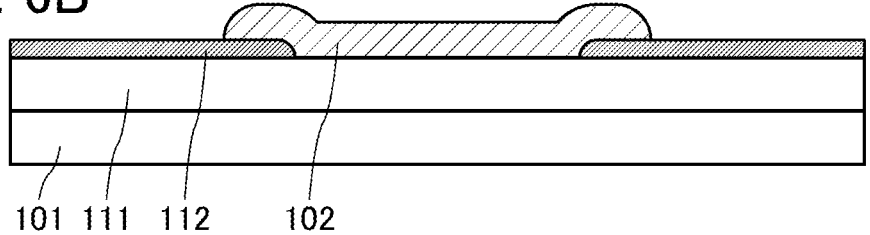

Next, the semiconductor film is deposited on the insulating layer 111 and the insulating layer 112 to fill the opening portion 110 with the semiconductor film. A resist mask is formed over the semiconductor film by photolithography or the like, an unnecessary portion of the semiconductor film is removed by etching, and then the resist mask is removed. Thus, the island-shaped semiconductor layer 102 can be formed (FIG. 6B).

The semiconductor film can be deposited by a sputtering method, a CVD method, a MBE method, an ALD method, a PLD method, or the like. Alternatively, a technique for formation of a thin film using a liquid material, such as a sol-gel method, a spray method, or a mist method, can be used. The semiconductor film is preferably deposited by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

As the mask used for etching the semiconductor film, a hard mask made of an inorganic film or a metal film may be used. For example, an inorganic film or a metal film is deposited on the semiconductor film and the inorganic film or the metal film is etched using a resist mask to be processed into an island shape, whereby the hard mask is formed. Then, the semiconductor film is etched using the hard mask as a mask and the hard mask is removed, so that an island-shaped semiconductor layer may be formed. In the case of minute processing, in particular, by using the hard mask, a reduction in pattern width in accordance with side-etching of the resist and the like can be suppressed and the predetermined shape can be obtained stably (without variation); thus, variation in the electrical characteristics of the transistor 100 can be reduced.

Note that heat treatment may be performed after the deposition of the semiconductor film. The heat treatment may be performed at a temperature higher than or equal to 250° C. and lower than or equal to 650° C., preferably higher than or equal to 300° C. and lower than or equal to 500° C., in an inert gas atmosphere, in an atmosphere containing an oxidizing gas at 10 ppm or more, or under reduced pressure. Alternatively, the heat treatment may be performed in such a manner that heat treatment is performed in an inert gas atmosphere, and then another heat treatment is performed in an atmosphere containing an oxidization gas at 10 ppm or more, in order to compensate desorbed oxygen. By the heat treatment, oxygen is supplied from the insulating layer 111 to the semiconductor film (or the semiconductor layer 102), which enables a reduction in oxygen vacancies in the oxide semiconductor included in the semiconductor layer 102. Note that the heat treatment may be performed directly after the deposition of the semiconductor film or may be performed after the semiconductor film is processed into the island-shaped semiconductor layer 102.

<Formation of Pair of Electrodes>

Figure 6C:
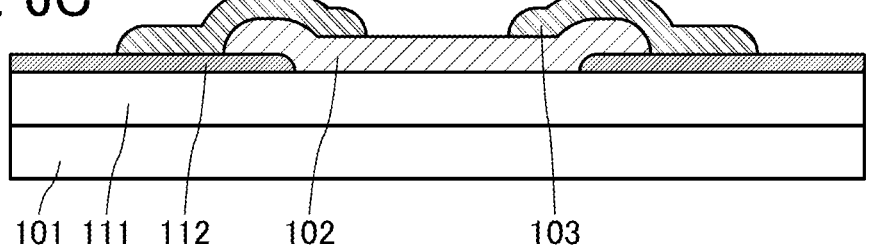

Next, a conductive film is deposited on the insulating layer 112 and the semiconductor layer 102. A resist mask is formed over the conductive film by a photolithography method or the like, an unnecessary portion of the conductive film is removed by etching, and then the resist mask is removed. Thus, the pair of electrodes 103 can be formed (FIG. 6C).

The conductive film can be deposited by a sputtering method, an evaporation method, a CVD method, or the like.

Here, in some cases, an upper portion of the semiconductor layer 102 is partly etched in the etching of the conductive film to reduce the thickness of a portion where the pair of electrodes 103 does not overlap with the semiconductor layer 102. For this reason, the semiconductor film to be the semiconductor layer 102 is preferably formed to have a large thickness in advance in consideration of the thickness of the etched layer.

[Formation of Gate Insulating Layer and Gate Electrode]

Next, the insulating layer 104 is deposited on the insulating layer 112, the semiconductor layer 102, and the pair of electrodes 103. A conductive film is deposited on the insulating layer 104.

The insulating layer 104 can be formed by a sputtering method, a CVD method, an MBE method, an ALD method, a PLD method, or the like. In particular, it is preferable that the insulating layer be deposited by a CVD method, further preferably a plasma CVD method because coverage can be further improved.

The conductive film later serves as the gate electrode 105. The conductive film can be deposited by a sputtering method, an evaporation method, a CVD method, or the like, for example.

Figure 6D:
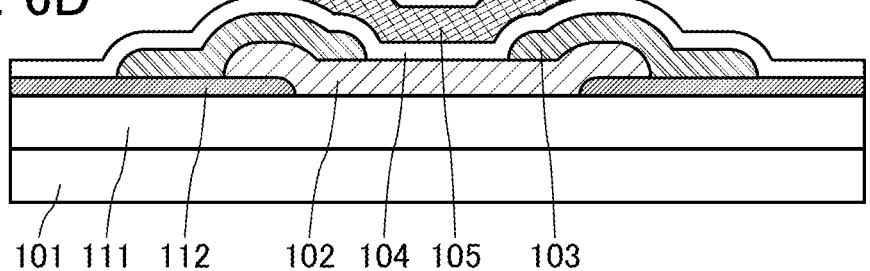

Next, a resist mask is formed over the conductive film by a photolithography method or the like. After that, an unnecessary portion of the conductive film is removed. Then, the resist mask is removed. Thus, the gate electrode 105 can be formed (FIG. 6D).

In the case of forming the structures illustrated in FIGS. 3A and 3B, after the conductive film is etched, the insulating layer 104 can be successively etched. Alternatively, after the resist mask is removed, the insulating layer 104 can be etched using the gate electrode 105 as a hard mask.

In the case of forming the structures illustrated in FIGS. 4A and 4B, the insulating layer 104 and the gate electrode 105 can be processed using resist masks with different patterns. For example, after the insulating layer 104 is processed, the conductive film is deposited, and the gate electrode 105 is formed. Alternatively, after the insulating layer and the conductive film are deposited in this order and the conductive film is processed to form the gate electrode 105, a different resist mask can be newly formed to process the insulating layer 104.

<Formation of Insulating Layer>

Figure 6E:
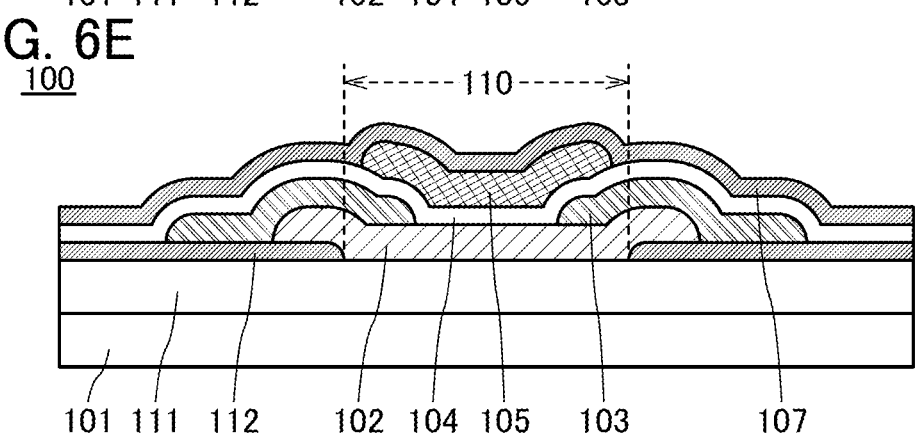

Next, the insulating layer 107 is formed over the insulating layer 104 and the gate electrode 105 (FIG. 6E).

The insulating layer 107 can be formed by a sputtering method, a CVD method, an MBE method, an ALD method, a PLD method, or the like. In particular, it is preferable that the insulating layer 107 be deposited by a CVD method, more preferably a plasma CVD method because coverage can be favorable.

The insulating layer 107 is preferably deposited under an atmosphere containing oxygen in a manner similar to the deposition of the insulating layer 112 because oxygen can be introduced into the insulating layer 104 provided under the insulating layer 107. The insulating layer 104 is provided in contact with the semiconductor layer 102; thus, oxygen can be supplied also from the insulating layer 104 to the semiconductor layer 102 by heating.

Through the above process, the transistor 100 can be manufactured.

<Heat Treatment>

A heat treatment may be performed after the insulating layer 107 is formed. Through the heat treatment, oxygen is supplied from the insulating layer 111 and the like to the semiconductor layer 102, whereby oxygen vacancies in the semiconductor layer 102 can be reduced. At this time, oxygen released from the insulating layer 111 and the semiconductor layer 102 is effectively confined in the insulating layer 107, and release of oxygen to the outside is suppressed. Thus, the amount of oxygen released from the insulating layer 111 and the like and supplied to the semiconductor layer 102 can be increased, so that the oxygen vacancies in the semiconductor layer 102 can be effectively reduced.

The above is the description of the manufacturing method example of the transistor 100.

At least part of this embodiment can be implemented in combination with any of the embodiments described in this specification as appropriate.

Embodiment 2

In this embodiment, a structural example of a transistor with a structure partly different from that of the transistor described in Embodiment 1 is described. Note that description of the portions already described is omitted and only different portions are described in detail. Even when positions and shapes of components are different from those in the above example, the same reference numerals are used as long as the components have the same functions as those in the above example, and detailed description thereof is omitted in some cases.

Structural Example

Figure 7A:
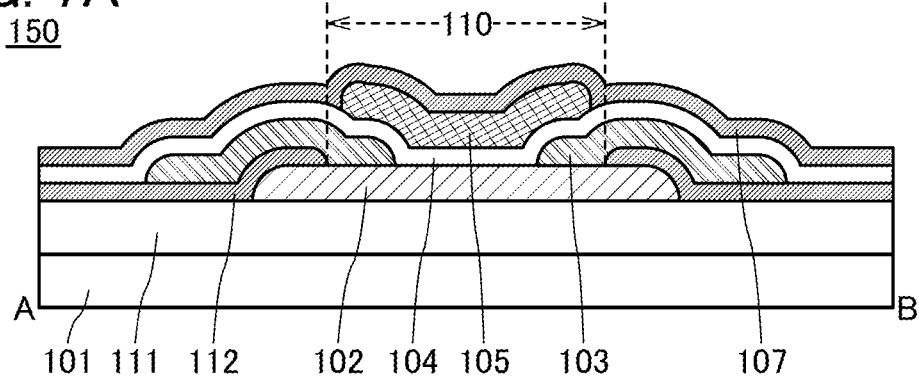
FIGS. 7A and 7B illustrate a structural example of the semiconductor device of one embodiment.
Figure 7B:
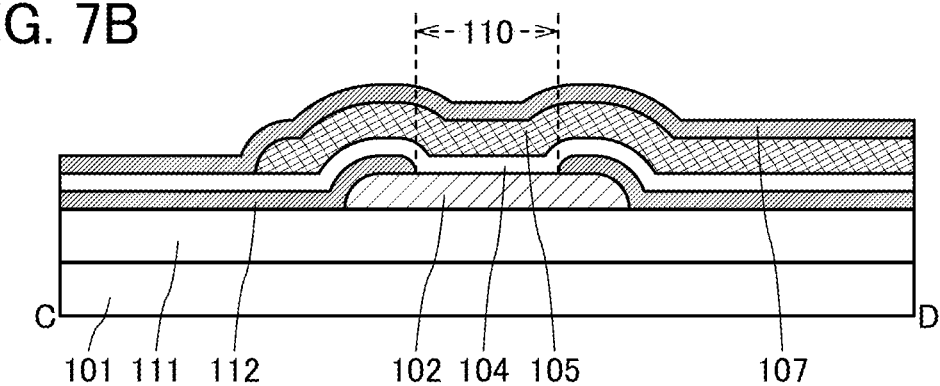

FIGS. 7A and 7B are schematic cross-sectional views of a transistor 150 described in this structural example. Note that FIG. 1A can be cited as a schematic top view of the transistor 150.

A main difference between the transistor 150 and the transistor 100 described in Embodiment 1 is the position of the insulating layer 112.

In the transistor 150, the semiconductor layer 102 is provided in contact with the top surface of the insulating layer 111, and the insulating layer 112 is provided to cover a top end portion of the semiconductor layer 102. That is, the opening portion 110 provided in the insulating layer 112 is positioned over the semiconductor layer 102.

The pair of electrodes 103 extends over an end portion of the insulating layer 112 on the opening portion 110 side and is in contact with the top surface of the semiconductor layer 102 overlapping with the opening portion 110.

In such a structure, a step made by the end portion of the insulating layer 112 on the opening portion 110 side is not positioned under the semiconductor layer 102; thus, the semiconductor layer 102 can be formed over a comparatively flat surface. Thus, the thickness and the film quality of the semiconductor layer 102 can be uniform, achieving a further reduction in the variation or change of electrical characteristics of the transistors 150.

The area of contact between the insulating layer 111 and the semiconductor layer 102 can be increased, so that the amount of oxygen supplied from the insulating layer 111 to the semiconductor layer 102 by heating can be increased.

The shape of the insulating layer 104 is not limited to that in the structure illustrated in FIGS. 7A and 7B and may be any of shapes as in Embodiment 1, FIGS. 3A and 3B, FIGS. 4A and 4B, and the like. Furthermore, as described in Embodiment 1 (FIGS. 5A to 5C and FIGS. 19A to 19D), the first oxide layer 121 and/or the second oxide layer 122 may be provided.

Furthermore, as illustrated in FIGS. 17A to 17D, the gate electrode 105a may be provided in addition to the gate electrode 105 in FIGS. 7A and 7B. Examples in that case are shown in FIGS. 20A and 20B. Note that the gate electrode 105a may be supplied with a constant voltage or a pulse signal. Furthermore, the gate electrode 105a may be electrically connected to the gate electrode 105; examples in that case are shown in FIGS. 20C and 20D.

Figure 21A:
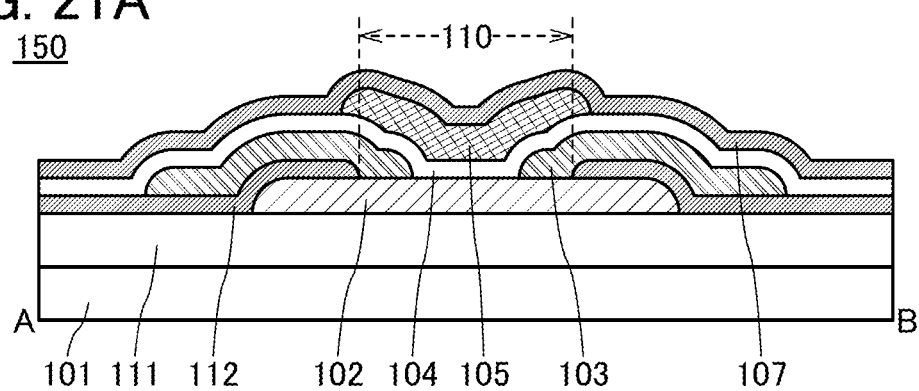
FIGS. 21A and 21B illustrate a structural example of a semiconductor device of one embodiment.
Figure 21B:
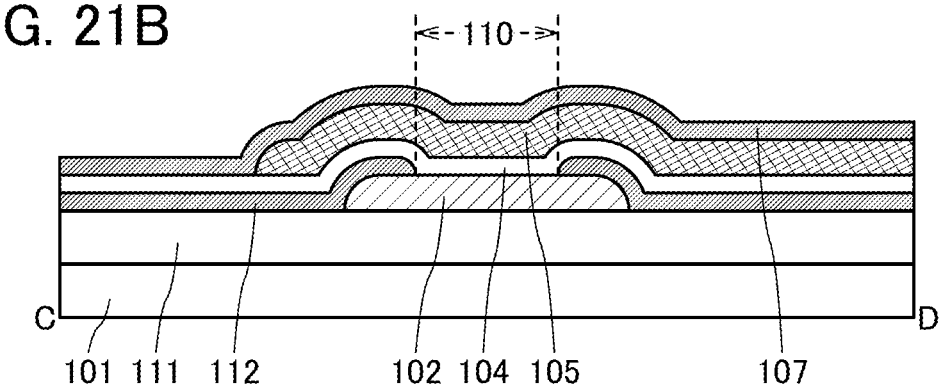

Note that the layout of the opening portion 110 can be changed variously. FIGS. 21A and 21B illustrate an example of the case where the opening portion 110 is smaller than that in FIGS. 7A and 7B.

The above is the description of this structure example.

Example of Manufacturing Method

An example of a method for manufacturing the transistor 150 described in the above structural example is described below. Note that description of the portions already described in Embodiment 1 is omitted and only different portions are described.

First, the insulating layer 111 is formed over the substrate 101. The insulating layer 111 is formed by a method similar to that described in Embodiment 1.

Figure 8A:
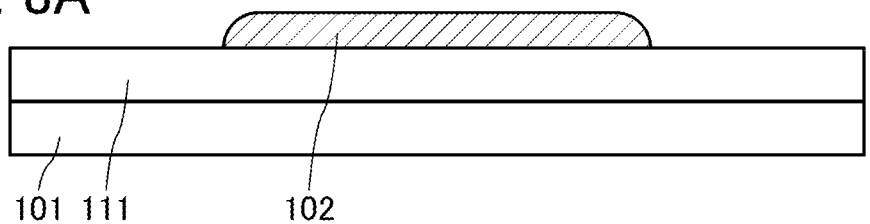
FIGS. 8A to 8C illustrate an example of a method for manufacturing the semiconductor device of one embodiment.

Next, the semiconductor film is deposited on the insulating layer 111. A resist mask is formed over the semiconductor film by a photolithography method or the like, an unnecessary portion of the semiconductor film is removed by etching, and then the resist mask is removed. Thus, the island-shaped semiconductor layer 102 can be formed (FIG. 8A).

Figure 8B:
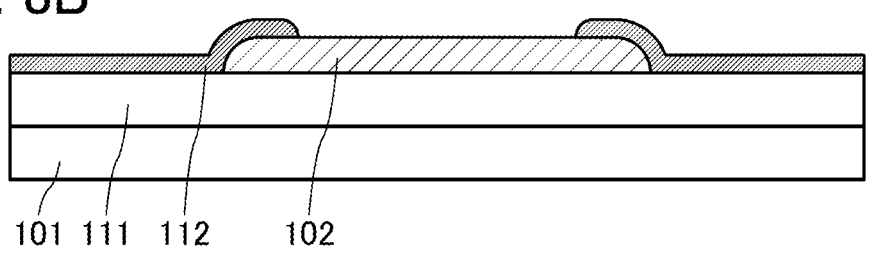

Next, the insulating layer 112 is deposited on the insulating layer 111 and the semiconductor layer 102. Then, the opening portion 110 is formed in a portion of the insulating layer 112 that overlaps with the semiconductor layer 102 (FIG. 8B).

The deposition of the insulating layer 112 and the formation of the opening portion 110 can be performed by a method similar to that described in Embodiment 1.

Etching for forming the opening portion 110 in the insulating layer 112 is preferably performed by a method in which the semiconductor layer 102 is not etched or etching selectivity of the insulating layer 112 with respect to the semiconductor layer 102 is high enough. Note that when the opening portion 110 is formed, part of a top portion of the semiconductor layer 102 is etched and the thickness of a region of the semiconductor layer 102 that overlaps with the opening portion 110 is reduced in some cases.

So far, the island-shaped semiconductor layer 102 is formed over the insulating layer 111, and the insulating layer 112 having the opening portion 110 over the semiconductor layer 102 is formed.

Embodiment 1 can be referred to for the subsequent steps. That is, the pair of electrodes 103, the insulating layer 104, the gate electrode 105, and the insulating layer 107 are formed in this order by a method similar to that described above.

Figure 8C:
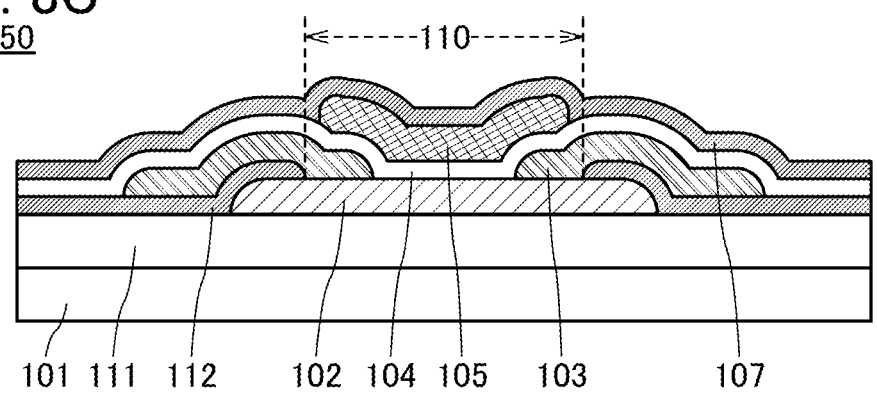

By the above method, the transistor 150 can be manufactured (FIG. 8C).

Modification Example

A manufacturing method that is partly different from the above-described manufacturing method is described below.

First, the insulating layer 111 is formed by a method similar to that described above.

Figure 9A:
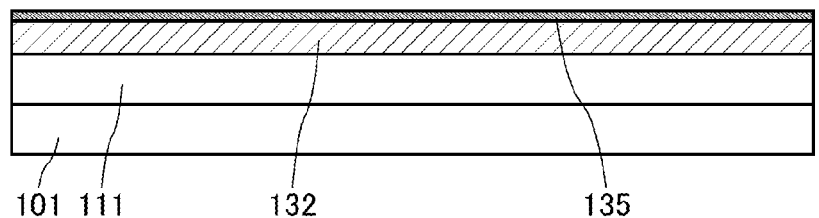

Next, a semiconductor film 132 and a protective layer 135 are deposited in this order (FIG. 9A).

The protective layer 135 is a layer for preventing the top surface of the semiconductor layer 102 from being etched and for reducing damage to the semiconductor layer 102 due to etching for forming the opening portion 110 of the insulating layer 112 which is performed later. Furthermore, the protective layer 135 serves as a hard mask at the time of processing the semiconductor layer 102.

The protective layer 135 can be formed using an inorganic insulating material with which the etching selectivity of the insulating layer 112 to the protective layer 135 is sufficiently high. For example, the protective layer 135 can be formed using a material that can be used for the insulating layer 111 and the insulating layer 112. In the case where the insulating layer 112 and the protective layer 135 are formed using the same material, the protective layer 135 may be formed to a thickness large enough to prevent the protective layer 135 from being eliminated when the insulating layer 112 is etched to form the opening portion 110.

Figure 9B:
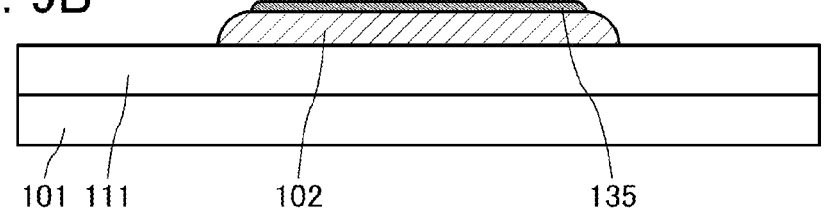

Next, a resist mask is formed over the protective layer 135 by a photolithography method or the like, and an unnecessary portion of the protective layer 135 is etched. After that, the semiconductor film 132 is etched using the resist mask or the protective layer 135 as a mask, and the resist mask is removed, so that the island-shaped semiconductor layer 102 and an island-shaped protective layer 135 over the semiconductor layer 102 can be formed (FIG. 9B). Note that the resist mask may be removed immediately after processing the protective layer 135 or after processing the semiconductor layer 102.

Next, the insulating layer 112 is deposited on the insulating layer 111 and a stacked body of the semiconductor layer 102 and the protective layer 135.

Then, part of the insulating layer 112 that overlaps with the semiconductor layer 102 is etched to form the opening portion 110. So far, the protective layer 135 is provided over a region of the semiconductor layer 102 that overlaps with the opening portion 110.

Figure 9C:
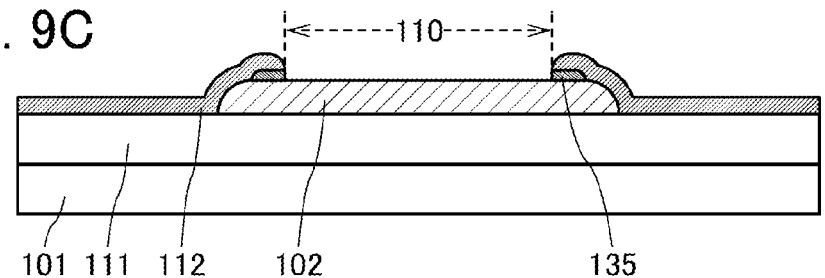
Figure 9C:
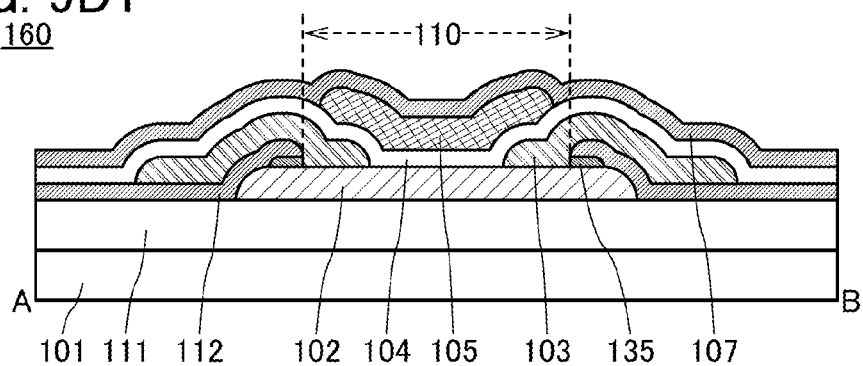
Figure 9C:
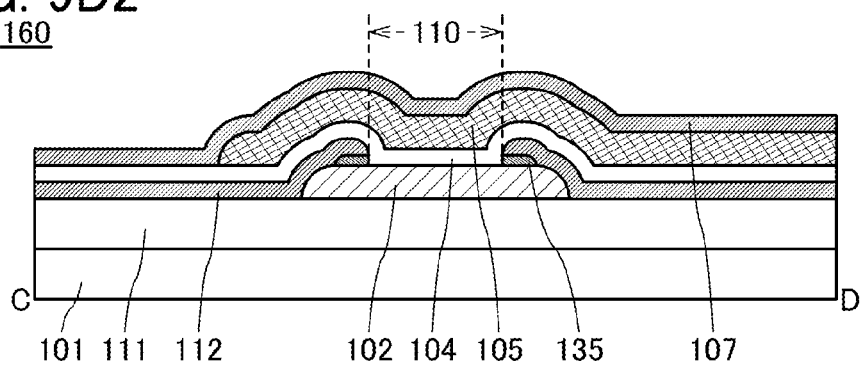

Then, part of the protective layer 135 that overlaps with the opening portion 110 is etched using the insulating layer 112 as a mask (FIG. 9C).

As described above, when the opening portion 110 of the insulating layer 112 is formed, the insulating layer 112 is etched with the top portion of the semiconductor layer 102 covered with the protective layer 135, whereby the top portion of the semiconductor layer 102 can be prevented from being etched or the semiconductor layer 102 can be prevented from being damaged by etching.

Embodiment 1 and the above-described example of the manufacturing method can be referred to for the subsequent steps. That is, the pair of electrodes 103, the insulating layer 104, the gate electrode 105, and the insulating layer 107 are formed in this order by a method similar to that described above.

By the above method, a transistor 160 can be manufactured (see FIGS. 9D1 and 9D2). FIG. 9D1 is a schematic cross-sectional view in the channel length direction of the transistor 160. FIG. 9D2 is a schematic cross-sectional view in the channel width direction of the transistor 160.

As illustrated in FIGS. 9D1 and 9D2, the protective layer 135 remains between the semiconductor layer 102 and the insulating layer 112 along the end portion of the insulating layer 112 on the opening portion 110 side. Part of the side surface of the protective layer 135 may be in contact with the pair of electrodes 103. Since the protective layer 135 is formed using an inorganic insulating material, the pair of electrodes 103 is not electrically short-circuited with each other through the protective layer 135, so that the electrical characteristics of the transistor 160 are not adversely affected by the remaining protective layer 135. The protective layer 135 positioned between the semiconductor layer 102 and the insulating layer 112 can also be referred to as insulating layer because an insulating material is used for the protective layer 135.

The above is the description of the modification example.

At least part of this embodiment can be implemented in combination with any of the embodiments described in this specification as appropriate.

Embodiment 3

An oxide semiconductor that can be favorably used for a semiconductor layer of a semiconductor device of one embodiment of the present invention is described in this embodiment.

An oxide semiconductor has a wide energy gap of 3.0 eV or more. A transistor including an oxide semiconductor film obtained by processing of the oxide semiconductor in an appropriate condition and a sufficient reduction in carrier density of the oxide semiconductor can have much lower leakage current between a source and a drain in an off state (off-state current) than a conventional transistor including silicon.

An applicable oxide semiconductor preferably contains at least indium (In) or zinc (Zn). In particular, In and Zn are preferably contained. In addition, as a stabilizer for reducing variation in electrical characteristics of the transistor using the oxide semiconductor, one or more selected from gallium (Ga), tin (Sn), hafnium (Hf), zirconium (Zr), titanium (Ti), scandium (Sc), yttrium (Y), and an lanthanoid (such as cerium (Ce), neodymium (Nd), or gadolinium (Gd), for example) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co, or the above-described element as a stabilizer. Alternatively, as the oxide semiconductor, a material expressed by a chemical formula, $In_2SnO_5(ZnO)_n$ (n>0, n is an integer) may be used.

For example, In—Ga—Zn-based oxide with an atomic ratio of In:Ga:Zn=1:1:1, 1:3:2, 1:3:4, 1:3:6, 3:1:2, or 2:1:3, or an oxide whose composition is in the neighborhood of the above compositions may be used.

Note that if the oxide semiconductor film contains a large amount of hydrogen, the hydrogen and the oxide semiconductor are bonded to each other, so that part of the hydrogen serves as a donor and causes generation of an electron that is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, or treatment for making the oxygen content of an oxide semiconductor film be in excess of that of the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled the oxygen adding treatment, so that the oxide semiconductor film can be an i-type (intrinsic) oxide semiconductor film or an oxide semiconductor film extremely close to an i-type oxide semiconductor (a substantially i-type oxide semiconductor). Note that "substantially intrinsic" means that the oxide semiconductor film includes extremely few (close to zero) carriers derived from a donor, and the carrier concentration thereof is lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

In this manner, the transistor including an i-type or substantially i-type oxide semiconductor film can have extremely favorable off-state current characteristics. For example, the drain current at the time when the transistor including an oxide semiconductor film is in an off-state at room temperature (25° C.) can be less than or equal to $1\times10^{-18}$ A, preferably less than or equal to $1\times10^{-21}$ A, and further preferably less than or equal to $1\times10^{-24}$ A; or at 85° C., less than or equal to $1\times10^{-15}$ A, preferably less than or equal to $1\times10^{-18}$ A, further preferably less than or equal to $1\times10^{-21}$ A. An off state of a transistor refers to a state where gate voltage is lower than the threshold voltage in an n-channel transistor. Specifically, the transistor is in an off state when the gate voltage is lower than the threshold voltage by 1V or more, 2V or more, or 3V or more.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

In this specification, a term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. In addition, a term "perpendicular" indicates that the angle formed between two straight lines is greater than or equal to 80° and less than or equal to 100°, and accordingly includes the case where the angle is greater than or equal to 85° and less than or equal to 95°. A term "substantially perpendicular" indicates that the angle formed between two straight lines is greater than or equal to 60° and less than or equal to 120°.

In this specification, the trigonal and rhombohedral crystal systems are included in the hexagonal crystal system.

The CAAC-OS film is an oxide semiconductor films having a plurality of c-axis aligned crystal parts.

When a combined analysis image (also referred to as a high-resolution TEM image) of a bright-field image and a diffraction pattern of the CAAC-OS film is observed by a transmission electron microscope (TEM), a plurality of crystal parts is seen. However, a boundary between crystal parts, that is, a grain boundary is not clearly observed even in the high-resolution TEM image. Thus, in the CAAC-OS film, a reduction in electron mobility due to the grain boundary is less likely to occur.

In the high-resolution cross-sectional TEM image of the CAAC-OS film observed in a direction substantially parallel to the sample surface, metal atoms arranged in a layered manner are seen in the crystal parts. Each metal atom layer reflects unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

In the high-resolution plan-view TEM image of the CAAC-OS film observed in a direction substantially perpendicular to the sample surface, metal atoms arranged in a triangular or hexagonal configuration are seen in the crystal parts. However, there is no regularity of arrangement of metal atoms between different crystal parts.

From the results of the cross-sectional TEM image and the plan-view TEM image, alignment is found in the crystal parts in the CAAC-OS film.

Most of the crystal parts included in the CAAC-OS film each fit inside a cube whose one side is less than 100 nm. Thus, the crystal part included in the CAAC-OS film can fit inside a cube whose one side is less than 10 nm, less than 5 nm, or less than 3 nm. Note that one large crystal region can be formed if a plurality of crystal parts included in the CAAC-OS film are connected to each other. For example, a crystal region with an area of 2500 $nm^2$ or more, 5 $\mu m^2$ or more, or 1000 $\mu m^2$ or more can be observed in the plan-view TEM image.

The CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Analysis (ϕ scan) is performed under conditions where the sample is rotated around a normal vector of the sample surface as an axis (ϕ axis) with 2θ fixed at around 56°. When the sample is a single-crystal oxide semiconductor film of $InGaZnO_4$, six peaks appear. The six peaks are derived from crystal planes equivalent to the (110) plane. In contrast, when the sample is the CAAC-OS film, a peak is not clearly observed.

The above results mean that in the CAAC-OS film having c-axis alignment, the directions of a-axes and b-axes are different between crystal parts, but the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is oriented in a direction parallel to a normal vector of a formation surface or a normal vector of a top surface. Thus, for example, when the shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, if crystal growth leading to the crystal parts of the CAAC-OS film occurs from the vicinity of the top surface of the film, the proportion of the c-axis aligned crystal parts in the vicinity of the top surface may be higher than that in the vicinity of the formation surface. Furthermore, when an impurity is added to the CAAC-OS film, a region to which the impurity is added is altered, and the proportion of the c-axis aligned crystal parts in the CAAC-OS film can vary depending on regions.

Note that when the CAAC-OS film with an $InGaZnO_4$ crystal is analyzed by an out-of-plane method, a peak of 2θ may be observed at around 36°, in addition to the peak of 2θ at around 31°. The peak of 2θ at around 36° indicates that a crystal having no c-axis alignment is included in part of the CAAC-OS film. It is preferable that a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (molecular radius), and thus disturbs the atomic arrangement of the oxide semiconductor film and causes a decrease in crystallinity if contained in the oxide semiconductor film. Note that the impurity contained in the oxide semiconductor film might serve as a carrier trap or a carrier generation source.

The CAAC-OS film is an oxide semiconductor film having a low density of defect states. Oxygen vacancies in the oxide semiconductor film may serve as carrier traps or carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and thus may behave like fixed electric charge. Accordingly, the transistor which includes the oxide semiconductor film having high impurity concentration and a high density of defect states can have unstable electrical characteristics.

With the use of the CAAC-OS film in a transistor, variation in the electrical characteristics of the transistor due to irradiation with visible light or ultraviolet light is small.

Next, a microcrystalline oxide semiconductor film is described.

In the high-resolution TEM image of the microcrystalline oxide semiconductor film, there are a region where a crystal part is clearly observed and a region where a crystal part is not observed. In most cases, the crystal part size in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high-resolution TEM image of the nc-OS film, a grain boundary cannot be clearly observed sometimes.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a beam diameter larger than the diameter of a crystal part, a peak which shows a crystal plane does not appear. Further, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than or equal to the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. For this reason, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more kinds of an amorphous oxide semiconductor film, a microcrystalline oxide semiconductor film, and a CAAC-OS film, for example.

At least part of this embodiment can be implemented in combination with any of the other embodiments described in this specification as appropriate.

Embodiment 4

In this embodiment, an example of a circuit including the transistor of one embodiment of the present invention is described with reference to drawings.

[Cross-Sectional Structure]

Figure 10A:
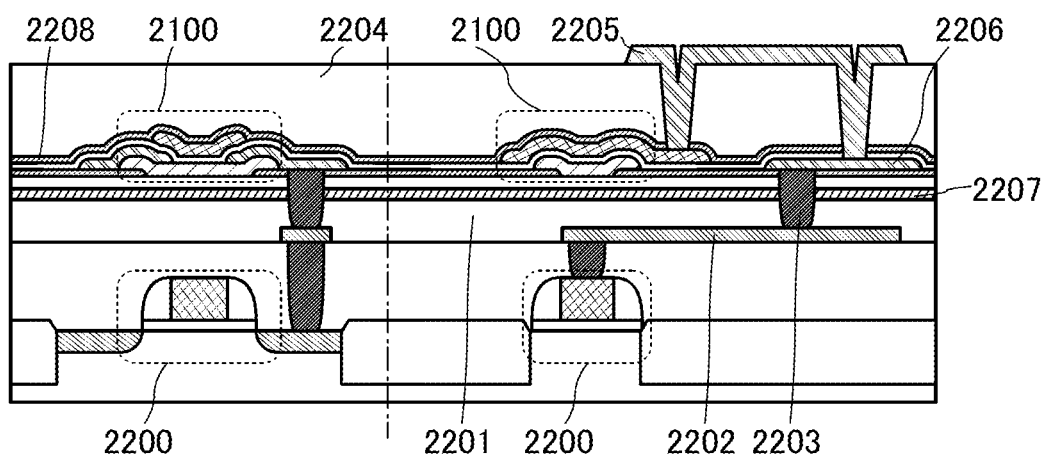
FIGS. 10A to 10C are a cross-sectional view and circuit diagrams of a semiconductor device of one embodiment.

FIG. 10A is a cross-sectional view of a semiconductor device of one embodiment of the present invention. The semiconductor device illustrated in FIG. 10A includes a transistor 2200 containing a first semiconductor material in a lower portion and a transistor 2100 containing a second semiconductor material in an upper portion. In FIG. 10A, an example is described in which the transistor described in Embodiment 1 as an example is used as the transistor 2100 containing the second semiconductor material. In FIG. 10A, the left side of a dashed-dotted line corresponds to a cross-sectional view of the transistor 2100 in the channel length direction, and the right side of the dashed-dotted line corresponds to a cross-sectional view of the transistor 2100 in the channel width direction.

Here, the first semiconductor material and the second semiconductor material are preferably materials having different band gaps. For example, the first semiconductor material can be a semiconductor material (such as silicon, germanium, silicon germanium, silicon carbide, or gallium arsenide) other than an oxide semiconductor, and the second semiconductor material can be an oxide semiconductor. A transistor using a material other than an oxide semiconductor, such as single crystal silicon, can operate at high speed easily. In contrast, a transistor using an oxide semiconductor has low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention which uses an oxide semiconductor.

FIG. 10A illustrates a structure in which the transistor 2100 is provided over the transistor 2200 with an insulating layer 2201 and an insulating layer 2207 provided therebetween. A plurality of wirings 2202 are provided between the transistor 2200 and the transistor 2100. Furthermore, wirings and electrodes provided over and under the insulating layers are electrically connected to each other through a plurality of plugs 2203 embedded in the insulating layers. An insulating layer 2204 covering the transistor 2100, a wiring 2205 over the insulating layer 2204, and a wiring 2206 formed by processing a conductive film that is also used for a pair of electrodes of the transistor 2100 are provided.

The stack of the two kinds of transistors reduces the area occupied by the circuit, allowing a plurality of circuits to be highly integrated.

Here, in the case where a silicon-based semiconductor material is used for the transistor 2200 provided in a lower portion, hydrogen in an insulating layer provided in the vicinity of the semiconductor layer of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulating layer provided in the vicinity of the semiconductor layer of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, it is particularly effective that the insulating layer 2207 having a function of preventing diffusion of hydrogen is provided between the transistors 2100 and 2200. The insulating layer 2207 makes hydrogen remain in the lower portion, thereby improving the reliability of the transistor 2200. In addition, since the insulating layer 2207 suppresses diffusion of hydrogen from the lower portion to the upper portion, the reliability of the transistor 2100 also can be improved.

The insulating layer 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, an insulating layer 2208 having a function of preventing diffusion of hydrogen is preferably formed over the transistor 2100 to cover the transistor 2100 including an oxide semiconductor layer. The insulating layer 2208 corresponds to the insulating layer 107 in any of Embodiments 1 and 2. For the insulating layer 2208, a material that is similar to that of the insulating layer 2207 can be used, and in particular, an aluminum oxide film is preferably used. The aluminum oxide film has a high shielding (blocking) effect of preventing penetration of both oxygen and impurities such as hydrogen and moisture. Thus, by using the aluminum oxide film as the insulating layer 2208 covering the transistor 2100, release of oxygen from the oxide semiconductor layer included in the transistor 2100 can be prevented and entry of water and hydrogen into the oxide semiconductor layer can be prevented.

Circuit Configuration Example

In the above structure, electrodes of the transistor 2100 and the transistor 2200 can be connected in a variety of ways; thus, a variety of circuits can be formed. Examples of circuit configurations which can be achieved by using a semiconductor device of one embodiment of the present invention are shown below.

<CMOS Circuit>

Figure 10B:
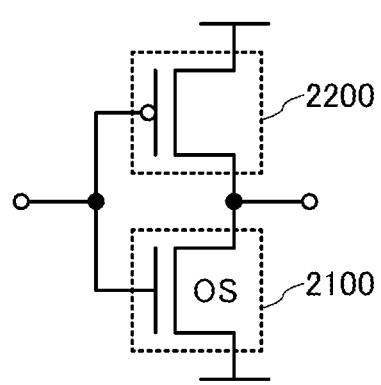

A circuit diagram in FIG. 10B shows a configuration of a so-called CMOS circuit in which the p-channel transistor 2200 and the n-channel transistor 2100 are connected to each other in series and in which gates of them are connected to each other.

<Analog Switch>

Figure 10C:
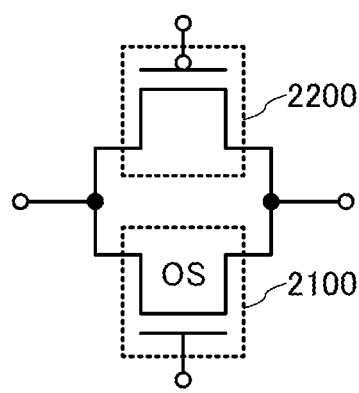

A circuit diagram in FIG. 10C shows a configuration in which sources of the transistors 2100 and 2200 are connected to each other and drains of the transistors 2100 and 2200 are connected to each other. With such a configuration, the transistors can function as a so-called analog switch.

Memory Device Example

Figure 11A:
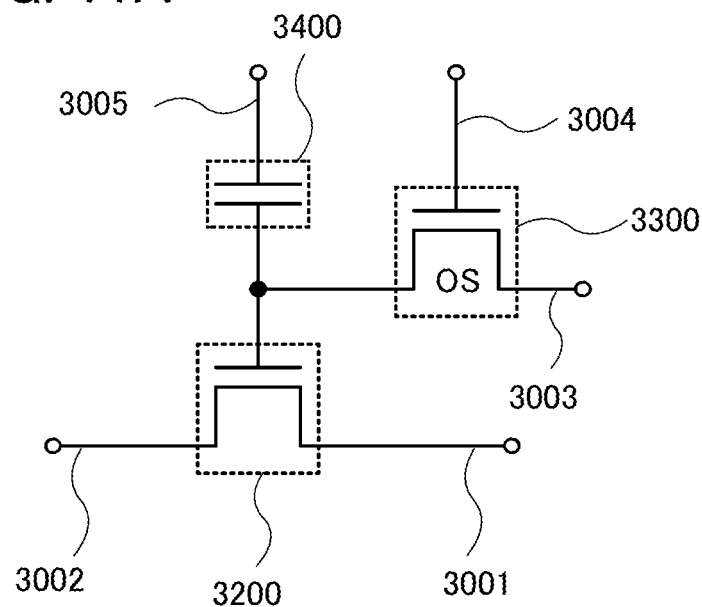
FIGS. 11A and 11B each illustrate a circuit diagram of a memory device of one embodiment.
Figure 11B:
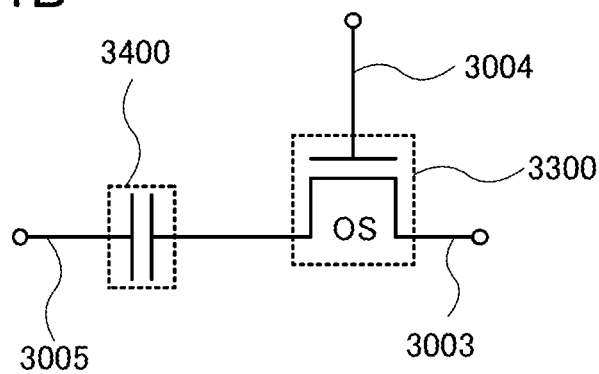

An example of a semiconductor device (memory device) which includes the transistor of one embodiment of the present invention, which can retain stored data even when not powered, and which has an unlimited number of write cycles is shown in FIGS. 11A and 11B.

The semiconductor device illustrated in FIG. 11A includes a transistor 3200 using a first semiconductor material, a transistor 3300 using a second semiconductor material, and a capacitor 3400. Note that any of the above-described transistors can be used as the transistor 3300.

The transistor 3300 is a transistor in which a channel is formed in a semiconductor layer including an oxide semiconductor. Since the off-state current of the transistor 3300 is low, stored data can be retained for a long period. In other words, power consumption can be sufficiently reduced because a semiconductor device in which refresh operation is unnecessary or the frequency of refresh operation is extremely low can be provided.

In FIG. 11A, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to a first terminal of the capacitor 3400. A fifth wiring 3005 is electrically connected to a second terminal of the capacitor 3400.

The semiconductor device in FIG. 11A has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is held (retaining).

Since the off-state current of the transistor 3300 is extremely low, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby the amount of the charge supplied to the gate electrode of the transistor 3200 can be determined. For example, in the case where the high-level charge is supplied to the gate electrode of the transistor 3200 in writing and the potential of the fifth wiring 3005 is $V_0$ ($>V_{th\_H}$), the transistor 3200 is turned on. On the other hand, in the case where the low-level charge is supplied to the gate electrode of the transistor 3200 in writing, even when the potential of the fifth wiring 3005 is $V_0$ ($<V_{th\_L}$), the transistor 3200 remains off. Thus, the data retained in the gate electrode of the transistor 3200 can be read by determining the potential of the second wiring 3002.

Note that in the case where memory cells are arrayed, it is necessary that data of a desired memory cell is read. In the case where such reading is not performed, the fifth wiring 3005 may be supplied with a potential at which the transistor 3200 is turned off regardless of the state of the gate electrode, that is, a potential lower than $V_{th\_H}$. Alternatively, the fifth wiring 3005 may be supplied with a potential at which the transistor 3200 is turned on regardless of the state of the gate electrode, that is, a potential higher than $V_{th\_L}$.

The semiconductor device illustrated in FIG. 11B is different mainly from the semiconductor device illustrated in FIG. 11A in that the transistor 3200 is not provided. Also in this case, writing and retaining operation of data can be performed in a manner similar to the semiconductor device illustrated in FIG. 11A.

Next, reading of data is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the first terminal of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the first terminal of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the first terminal of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely low off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating layer is not caused. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

At least part of this embodiment can be implemented in combination with any of the other embodiments described in this specification as appropriate.

Embodiment 5

In this embodiment, an RFID tag that includes the transistor described in the above embodiments or the memory device described in the above embodiment is described with reference to FIG. 12.

The RFID tag of this embodiment includes a memory circuit, stores necessary data in the memory circuit, and transmits and receives data to/from the outside by using contactless means, for example, wireless communication. With these features, the RFID tag can be used for an individual authentication system in which an object or the like is recognized by reading the individual information, for example. Note that the RFID tag is required to have extremely high reliability in order to be used for this purpose.

A configuration of the RFID tag will be described with reference to FIG. 12. FIG. 12 is a block diagram illustrating a configuration example of an RFID tag.

Figure 12:
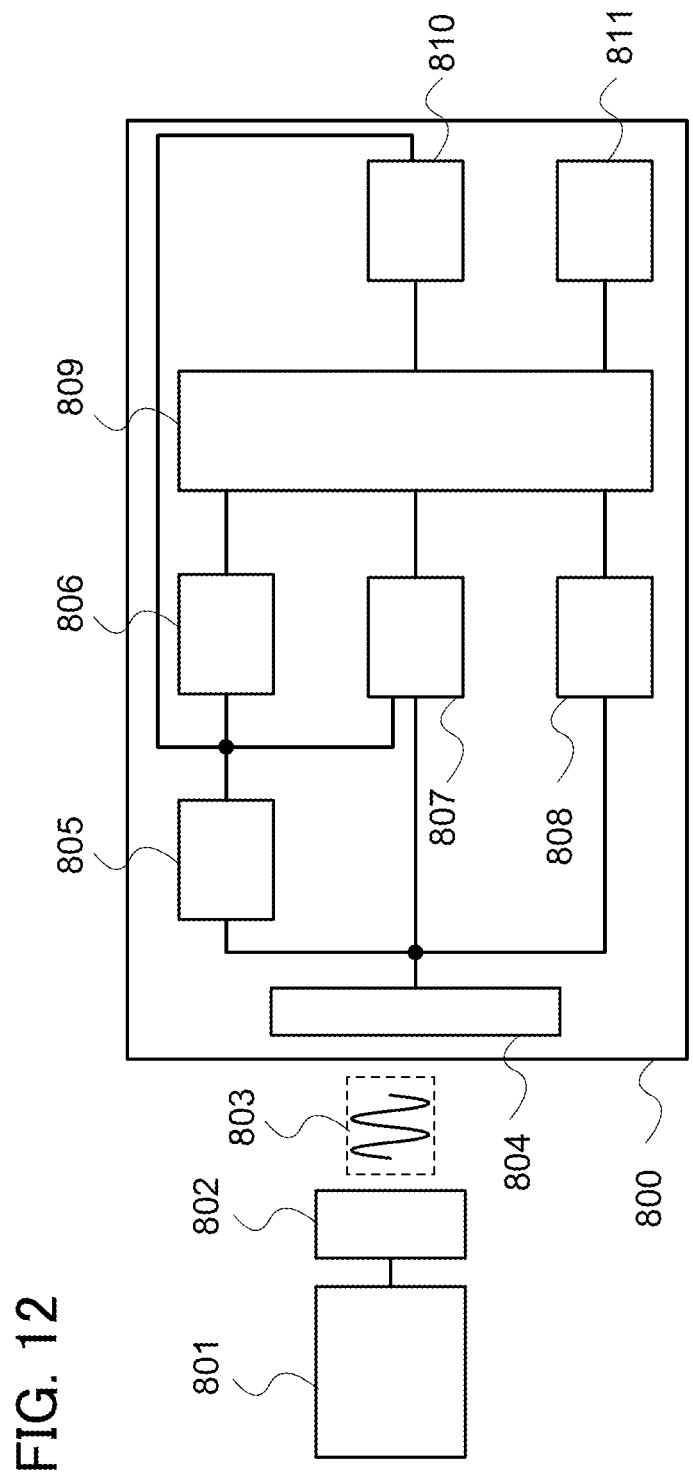
FIG. 12 illustrates a structural example of an RFID tag of one embodiment.

As shown in FIG. 12, an RFID tag 800 includes an antenna 804 which receives a radio signal 803 that is transmitted from an antenna 802 connected to a communication device 801 (also referred to as an interrogator, a reader/writer, or the like). The RFID tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RFID tag 800 described in this embodiment.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the memory circuit described in the above embodiment can be used as the memory circuit 810. Since the memory circuit of one embodiment of the present invention can retain data even when not powered, the memory circuit can be favorably used for an RFID tag. Furthermore, the memory circuit of one embodiment of the present invention needs power (voltage) needed for data writing significantly lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RFID tags, it is possible to put identification numbers to only good products to be shipped. Thus, the identification numbers of the shipped products are in series and customer management corresponding to the shipped products is easily performed.

At least part of this embodiment can be implemented in combination with any of the other embodiments described in this specification as appropriate.

Embodiment 6

In this embodiment, a CPU in which at least the transistor described in any of the above embodiments can be used and the memory device described in the above embodiment is included is described.

Figure 13:
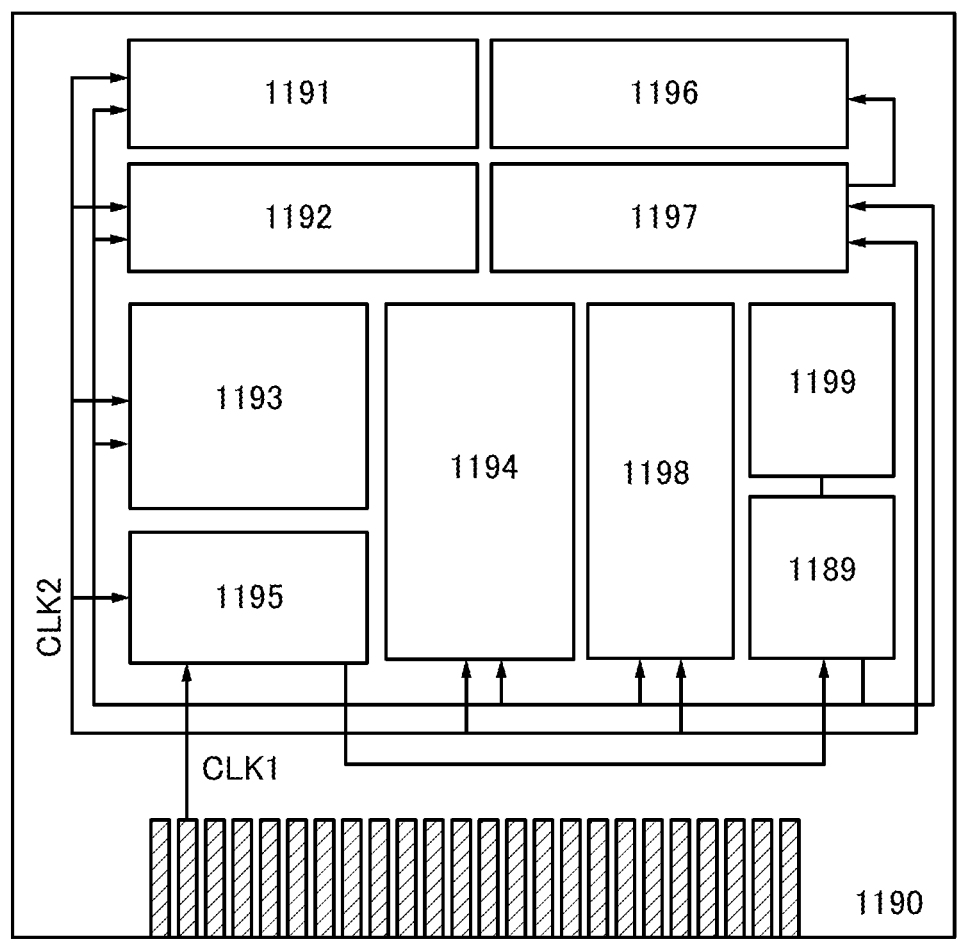
FIG. 13 illustrates a structural example of a CPU of one embodiment.

FIG. 13 is a block diagram illustrating a configuration example of a CPU at least partly including any of the transistors described in the above embodiments as a component.

The CPU illustrated in FIG. 13 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 13 is just an example in which the configuration has been simplified, and an actual CPU may have a variety of configurations depending on the application. For example, the CPU may have the following configuration: a structure including the CPU illustrated in FIG. 13 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 13, a memory cell is provided in the register 1196. For the memory cell of the register 1196, any of the transistors described in the above embodiments can be used.

In the CPU illustrated in FIG. 13, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 14:
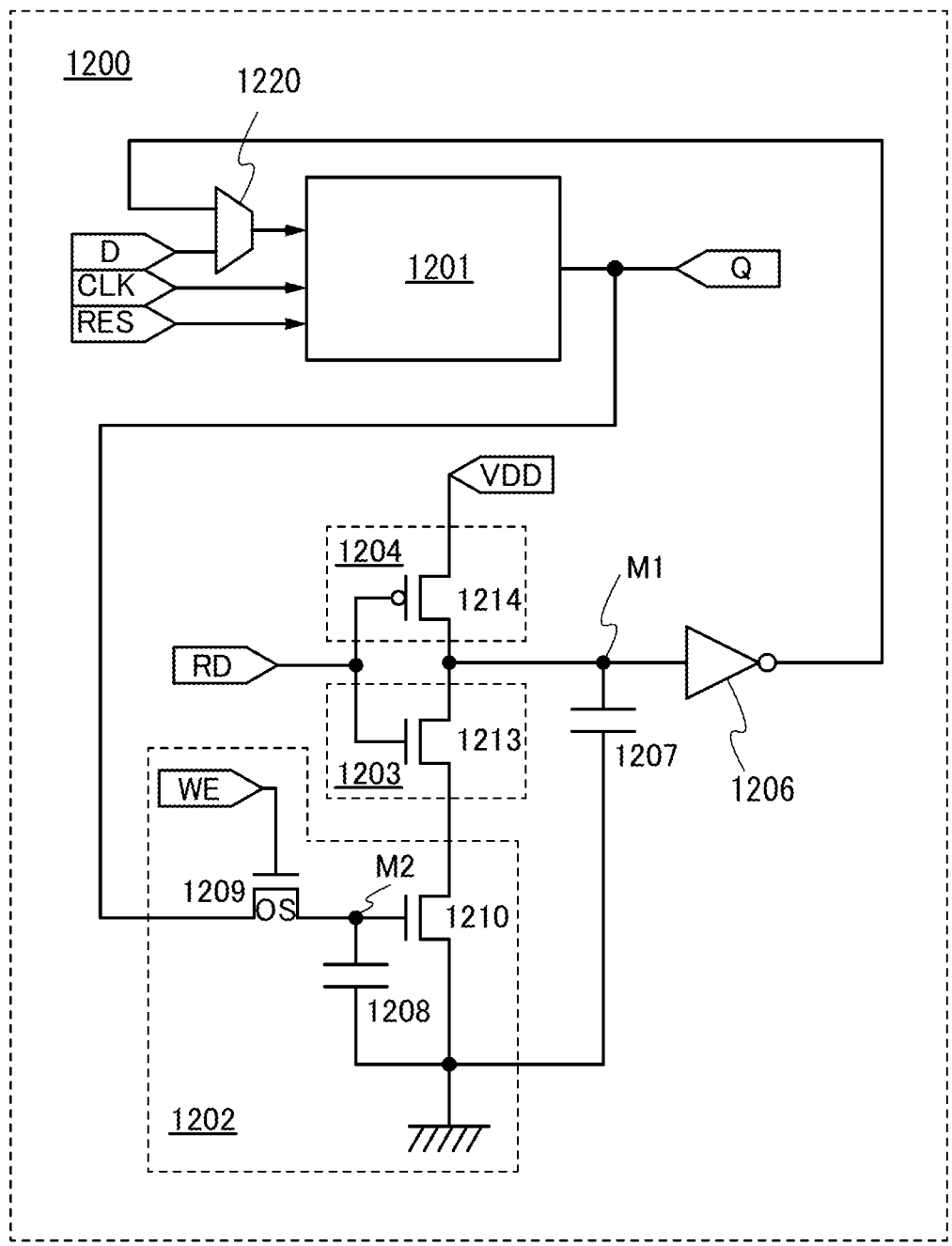
FIG. 14 is a circuit diagram of a memory element of one embodiment.

FIG. 14 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 14 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 14, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 14, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 1200 may be a transistor in which a channel is formed in an oxide semiconductor layer. Further alternatively, in the memory element 1200, a transistor in which a channel is formed in an oxide semiconductor layer can be included besides the transistor 1209, and a transistor in which a channel is formed in a layer or the substrate 1190 including a semiconductor other than an oxide semiconductor can be used for the rest of the transistors.

As the circuit 1201 in FIG. 14, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency identification (RF-ID).

At least part of this embodiment can be implemented in combination with any of the other embodiments described in this specification as appropriate.

Embodiment 7

In this embodiment, a structural example of a display panel of one embodiment of the present invention will be described.

Structural Example

Figure 22A:
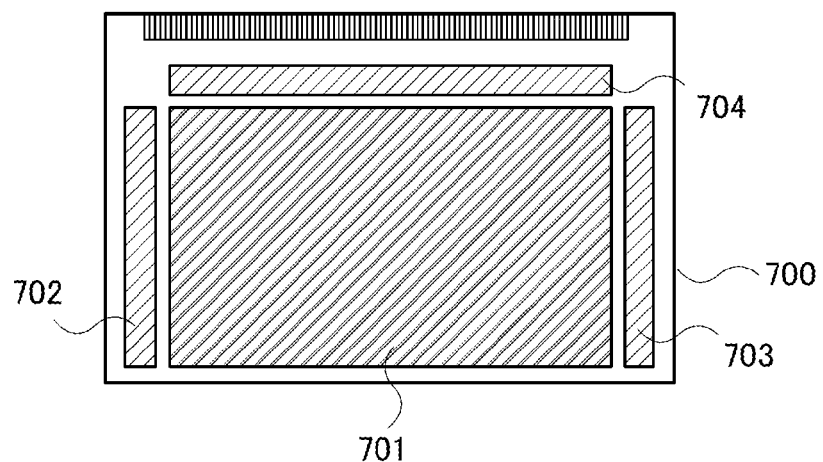
FIGS. 22A to 22C are a structural example and circuit diagrams of a display device of one embodiment.
Figure 22B:
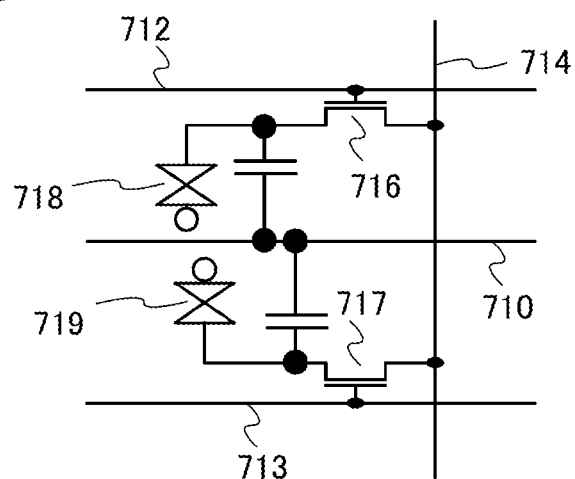
Figure 22C:
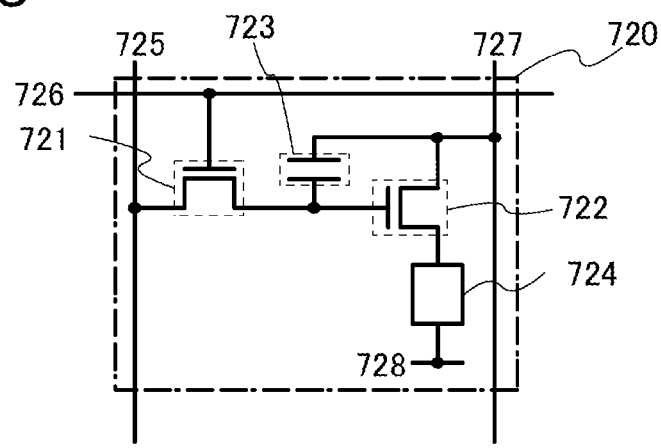

FIG. 22A is a top view of the display panel of one embodiment of the present invention. FIG. 22B is a circuit diagram illustrating a pixel circuit that can be used in the case where a liquid crystal element is used in a pixel in the display panel of one embodiment of the present invention. FIG. 22C is a circuit diagram illustrating a pixel circuit that can be used in the case where an organic EL element is used in a pixel in the display panel of one embodiment of the present invention.

The transistor in the pixel portion can be formed in accordance with any of the above embodiments. The transistor can be easily formed as an n-channel transistor, and thus part of a driver circuit that can be formed using an n-channel transistor can be formed over the same substrate as the transistor of the pixel portion. With the use of the transistor described in any of the above embodiments for the pixel portion or the driver circuit in this manner, a highly reliable display device can be provided.

FIG. 22A illustrates an example of a block diagram of an active matrix display device. A pixel portion 701, a first scan line driver circuit 702, a second scan line driver circuit 703, and a signal line driver circuit 704 are provided over a substrate 700 in the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels which include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 22A, the first scan line driver circuit 702, the second scan line driver circuit 703, and the signal line driver circuit 704 are formed over the same substrate 700 as the pixel portion 701. Accordingly, the number of components which are provided outside, such as a driver circuit, can be reduced, so that a reduction in cost can be achieved. Moreover, in the case where the driver circuit is provided outside the substrate 700, wirings would need to be extended and the number of connections of wirings would be increased, but when the driver circuit is provided over the substrate 700, the number of connections of the wirings can be reduced. Consequently, an improvement in reliability or yield can be achieved.

<Liquid Crystal Panel>

FIG. 22B illustrates an example of a circuit configuration of the pixel. Here, a pixel circuit which is applicable to a pixel of a VA liquid crystal display panel is illustrated.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a source or drain electrode layer 714 that functions as a data line is shared by the transistors 716 and 717. The transistor described in any of the above embodiments can be used as appropriate as each of the transistors 716 and 717. Thus, a highly reliable liquid crystal display panel can be provided.

The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer is spread in a V shape and the second pixel electrode layer is provided so as to surround the first pixel electrode layer.

A gate electrode layer of the transistor 716 is connected to the gate wiring 712, and a gate electrode layer of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

A storage capacitor may be formed using a capacitor wiring 710, a gate insulating film that functions as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 22B. For example, a switch, a resistor, a capacitor, a transistor, a sensor, a logic circuit, or the like may be added to the pixel illustrated in FIG. 22B.

<Organic EL Panel>

FIG. 22C illustrates another example of a circuit configuration of the pixel. Here, a pixel structure of a display panel including an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 22C illustrates an applicable example of a pixel circuit. Here, one pixel includes two n-channel transistors. Note that a metal oxide film of one embodiment of the present invention can be used for channel formation regions of the n-channel transistors. Furthermore, digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, the transistor described in any of the above embodiments can be used as appropriate. In this manner, a highly reliable organic EL display panel can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage greater than or equal to voltage which is the sum of power supply line voltage and the threshold voltage $V_{th}$ of the driver transistor 722 is applied to the signal line 725.

In the case of performing analog grayscale driving, a voltage greater than or equal to a voltage which is the sum of the forward voltage of the light-emitting element 724 and the threshold voltage $V_{th}$ of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 22C. For example, a switch, a resistor, a capacitor, a sensor, a transistor, a logic circuit, or the like may be added to the pixel circuit illustrated in FIG. 22C.

In the case where the transistor shown in any of the above embodiments is used for the circuit shown in FIGS. 22B and 22C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

At least part of this embodiment can be implemented in combination with any of the other embodiments described in this specification as appropriate.

Embodiment 8

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 15A to 15F illustrate specific examples of these electronic devices.

Figure 15A:
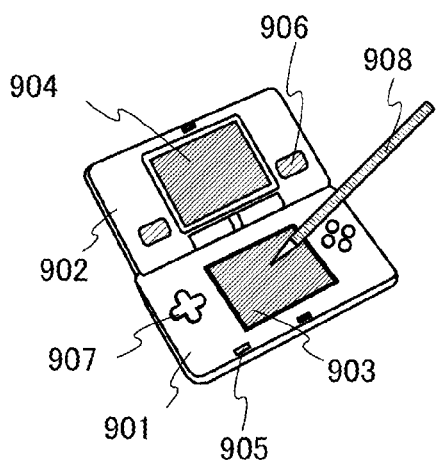
FIGS. 15A to 15F each illustrate an electronic device of one embodiment.

FIG. 15A illustrates a portable game console including a housing 901, a housing 902, a display portion 903, a display portion 904, a microphone 905, a speaker 906, an operation key 907, a stylus 908, and the like. Although the portable game machine in FIG. 15A has the two display portions 903 and 904, the number of display portions included in a portable game machine is not limited to this.

Figure 15B:
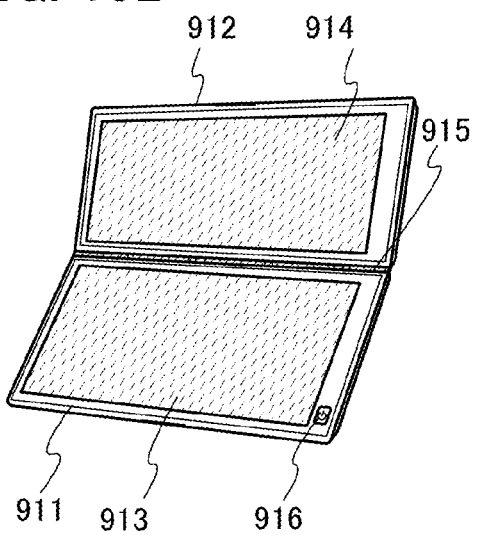

FIG. 15B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 15C:
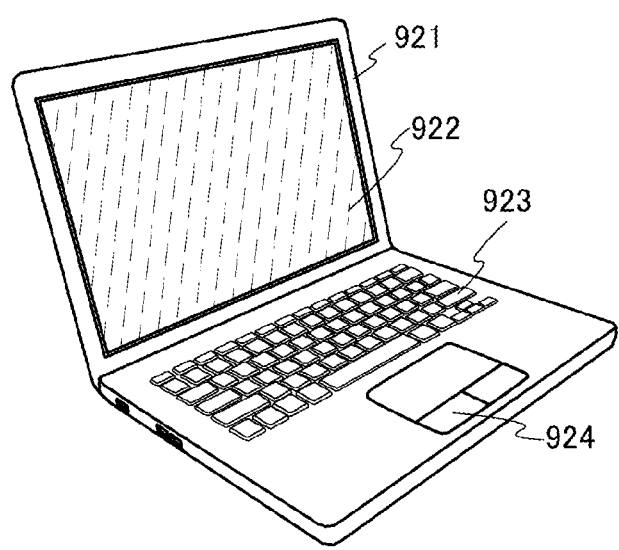

FIG. 15C illustrates a laptop personal computer, which includes a housing 921, a display portion 922, a keyboard 923, a pointing device 924, and the like.

Figure 15D:
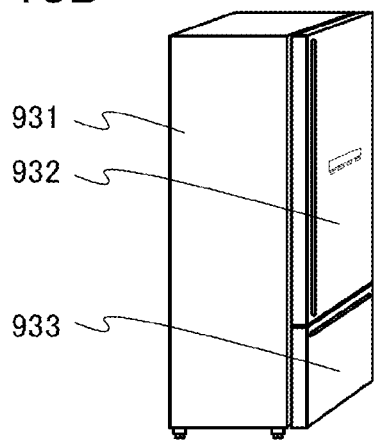

FIG. 15D illustrates an electric refrigerator-freezer including a housing 931, a door for a refrigerator 932, a door for a freezer 933, and the like.

Figure 15E:
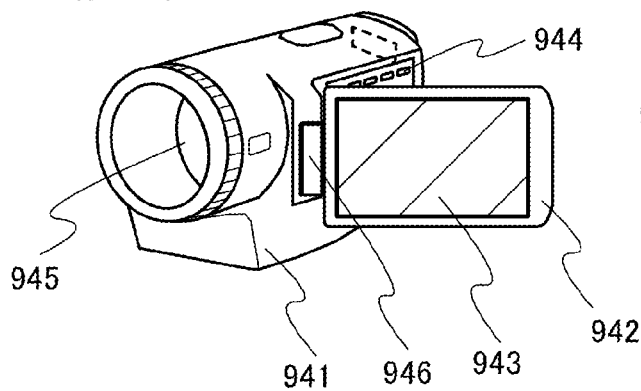

FIG. 15E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 15F:
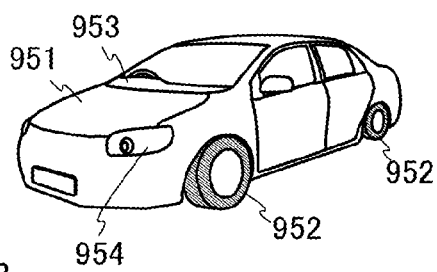
Figure 16A:
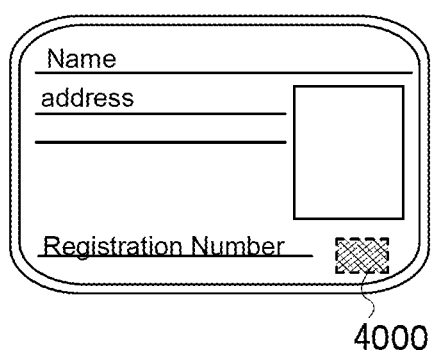
FIGS. 16A to 16F each show an application example of an RFID of one embodiment.
Figure 16B:
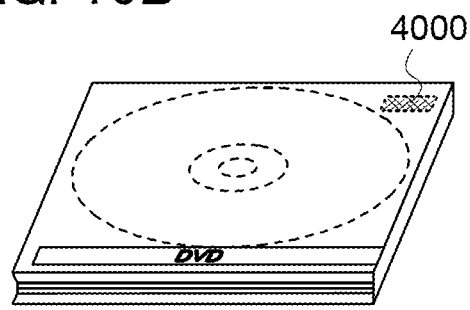
Figure 16C:
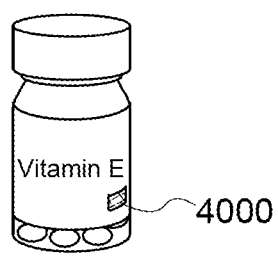
Figure 16D:
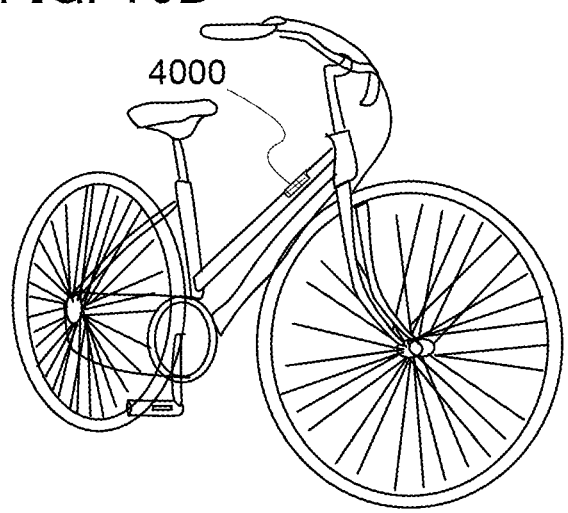
Figure 16E:
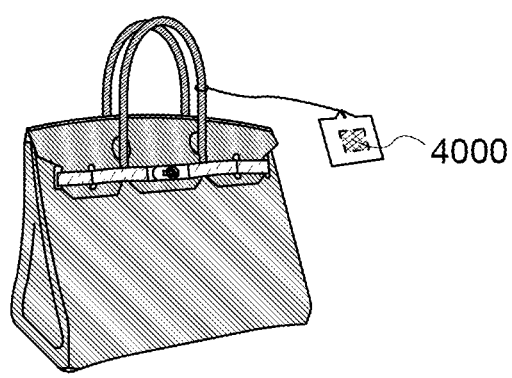
Figure 16F:
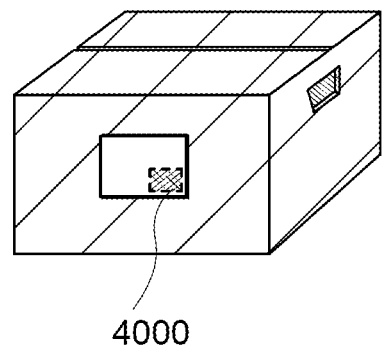

FIG. 15F illustrates an ordinary vehicle including a car body 951, wheels 952, a dashboard 953, lights 954, and the like.

At least part of this embodiment can be implemented in combination with any of the other embodiments described in this specification as appropriate.

Embodiment 9

In this embodiment, application examples of an RFID of one embodiment of the present invention will be described with reference to FIGS. 16A to 16F. The RFID is widely used and can be provided for, for example, products such as bills, coins, securities, bearer bonds, documents (e.g., driver's licenses or resident's cards, see FIG. 16A), packaging containers (e.g., wrapping paper or bottles, see FIG. 16C), recording media (e.g., DVD software or video tapes, see FIG. 16B), vehicles (e.g., bicycles, see FIG. 16D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 16E and 16F).

An RFID 4000 of one embodiment of the present invention is fixed to a product by being attached to a surface of the product or embedded in the product. For example, the RFID 4000 is fixed to each product by being embedded in paper of a book, or embedded in an organic resin of a package. Since the RFID 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RFID 4000 of one embodiment of the present invention, and the identification function can be utilized to prevent counterfeiting. Moreover, the efficiency of a system such as an inspection system can be improved by providing the RFID of one embodiment of the present invention for packaging containers, recording media, personal belongings, foods, clothing, household goods, electronic devices, or the like. Vehicles can also have higher security against theft or the like by being provided with the RFID of one embodiment of the present invention.

As described above, by using the RFID of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RFID can be preferably used for application in which data is not frequently written or read.

At least part of this embodiment can be implemented in combination with any of the other embodiments described in this specification as appropriate.

This application is based on Japanese Patent Application serial no. 2013-172169 filed with Japan Patent Office on Aug. 22, 2013, the entire contents of which are hereby incorporated by reference.

What is claimed is:

1. A semiconductor device comprising:
a first insulating layer comprising an oxide;
a second insulating layer over the first insulating layer, the second insulating layer including an opening portion;
a semiconductor layer over the first insulating layer and the second insulating layer and in contact with the first insulating layer in the opening portion;
an oxide layer over the semiconductor layer;
a first gate electrode overlapping with the semiconductor layer and the opening portion;
a gate insulating layer between the semiconductor layer and the first gate electrode; and
source and drain electrodes between the second insulating layer and the gate insulating layer, and electrically connected to the semiconductor layer.

2. The semiconductor device according to claim 1, wherein the semiconductor layer comprises an oxide semiconductor.

3. The semiconductor device according to claim 1, further comprising:
a second gate electrode,
wherein the first gate electrode and the second gate electrode overlap with each other with the semiconductor layer interposed therebetween.

4. The semiconductor device according to claim 1, wherein the opening portion is positioned inside the semiconductor layer when seen from above.

5. The semiconductor device according to claim 1, wherein the first insulating layer comprises a region comprising oxygen at a higher proportion than that of a stoichiometric composition.

6. The semiconductor device according to claim 1, wherein the second insulating layer comprises one of silicon nitride, silicon nitride oxide, aluminum oxide, aluminum oxynitride, gallium oxide, gallium oxynitride, yttrium oxide, yttrium oxynitride, hafnium oxide, and hafnium oxynitride.

7. The semiconductor device according to claim 1, wherein, the oxide layer comprises a same metal element as a metal element in the semiconductor layer.

8. The semiconductor device according to claim 1, wherein the source and drain electrodes cover end portions of the semiconductor layer and the oxide layer.

9. A semiconductor device comprising:
a first insulating layer comprising an oxide;
a semiconductor layer over the first insulating layer;
a second insulating layer over the semiconductor layer, the second insulating layer including an opening portion overlapping with the semiconductor layer;
source and drain electrodes electrically connected to the semiconductor layer through the opening portion and covering at least part of the second insulating layer;
a first gate electrode overlapping with the semiconductor layer and the opening portion; and
a gate insulating layer between the semiconductor layer and the first gate electrode.

10. The semiconductor device according to claim 9, further comprising a third insulating layer between the semiconductor layer and the second insulating layer.

11. The semiconductor device according to claim 9, wherein the semiconductor layer comprises an oxide semiconductor.

12. The semiconductor device according to claim 9, further comprising:
a first oxide layer and a second oxide layer which overlap with each other with the semiconductor layer interposed therebetween,
wherein the first oxide layer and the second oxide layer comprise a same metal element as a metal element in the semiconductor layer.

13. The semiconductor device according to claim 9, further comprising:
a second gate electrode,
wherein the first gate electrode and the second gate electrode overlap with each other with the semiconductor layer interposed therebetween.

14. The semiconductor device according to claim 9, wherein the opening portion is positioned inside the semiconductor layer when seen from above.

15. The semiconductor device according to claim 9, wherein the first insulating layer comprises a region comprising oxygen at a higher proportion than that of a stoichiometric composition.

16. The semiconductor device according to claim 9, wherein the second insulating layer comprises one of silicon nitride, silicon nitride oxide, aluminum oxide, aluminum oxynitride, gallium oxide, gallium oxynitride, yttrium oxide, yttrium oxynitride, hafnium oxide, and hafnium oxynitride.

17. A semiconductor device comprising:
a first insulating layer comprising an oxide;
a second insulating layer over the first insulating layer, the second insulating layer including an opening portion;
a first oxide layer over the first insulating layer and the second insulating layer and in contact with the first insulating layer in the opening portion;
a semiconductor layer over the first oxide layer;
a first gate electrode overlapping with the semiconductor layer and the opening portion;
a gate insulating layer between the semiconductor layer and the first gate electrode; and
source and drain electrodes between the second insulating layer and the gate insulating layer, and electrically connected to the semiconductor layer.

18. The semiconductor device according to claim 17, wherein the semiconductor layer comprises an oxide semiconductor.

19. The semiconductor device according to claim 17, further comprising:
a second oxide layer over the semiconductor layer,
wherein the first oxide layer and the second oxide layer comprise a same metal element as a metal element in the semiconductor layer.

20. The semiconductor device according to claim 17, further comprising:
a second gate electrode,
wherein the first gate electrode and the second gate electrode overlap with each other with the semiconductor layer interposed therebetween.

21. The semiconductor device according to claim 17, wherein the opening portion is positioned inside the semiconductor layer when seen from above.

22. The semiconductor device according to claim 17, wherein the first insulating layer comprises a region comprising oxygen at a higher proportion than that of a stoichiometric composition.

23. The semiconductor device according to claim 17, wherein the second insulating layer comprises one of silicon nitride, silicon nitride oxide, aluminum oxide, aluminum oxynitride, gallium oxide, gallium oxynitride, yttrium oxide, yttrium oxynitride, hafnium oxide, and hafnium oxynitride.

24. The semiconductor device according to claim 17, wherein the source and drain electrodes cover end portions of the semiconductor layer and the first oxide layer.

* * * * *